United States Patent
Ramer et al.

(10) Patent No.: US 8,201,967 B2
(45) Date of Patent: *Jun. 19, 2012

(54) LIGHT FIXTURE USING NEAR UV SOLID STATE DEVICE AND REMOTE SEMICONDUCTOR NANOPHOSPHORS TO PRODUCE WHITE LIGHT

(75) Inventors: David P. Ramer, Reston, VA (US); Jack C. Rains, Jr., Herndon, VA (US)

(73) Assignee: ABL IP Holding LLC, Conyers, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/940,634

(22) Filed: Nov. 5, 2010

(65) Prior Publication Data

US 2011/0127557 A1      Jun. 2, 2011

Related U.S. Application Data

(63) Continuation of application No. 12/629,614, filed on Dec. 2, 2009, now Pat. No. 7,845,825.

(51) Int. Cl.
*F21V 9/10* (2006.01)
(52) U.S. Cl. ................................ 362/231; 362/245
(58) Field of Classification Search ............ 362/230, 362/231, 245
See application file for complete search history.

(56) References Cited

U.S. PATENT DOCUMENTS

| | | |
|---|---|---|
| 3,636,341 A | 1/1972 | Miller |
| 5,502,626 A | 3/1996 | Armstrong et al. |
| 5,549,844 A | 8/1996 | Bringley et al. |
| 5,608,213 A | 3/1997 | Pinkus et al. |
| 5,753,918 A | 5/1998 | Pandelisev |
| 5,803,592 A | 9/1998 | Lawson |
| 5,851,428 A | 12/1998 | Matsuda et al. |
| 5,877,490 A | 3/1999 | Ramer et al. |

(Continued)

FOREIGN PATENT DOCUMENTS

WO       WO 01/66997 A2       9/2001

(Continued)

OTHER PUBLICATIONS

Pradhan, Narayan, et al., "An Alternative of CdSe Nanocrystal Emitters: Pure and Tunable Impurity Emissions in ZnSe Nanocrystals", Nov. 24, 2005, 127, pp. 17586-17587, J. A, Chem, Soc. Communications, web publication.

(Continued)

*Primary Examiner* — David V Bruce
(74) *Attorney, Agent, or Firm* — McDermott Will & Emery LLP

(57) ABSTRACT

For general lighting applications, a semiconductor chip produces near ultraviolet (UV) electromagnetic energy in a range of 380-420 nm, e.g. 405 nm. Semiconductor nanophosphors, typically doped semiconductor nanophosphors, are remotely positioned in an optic of a light fixture. Each phosphor is of a type or configuration that when excited by energy in the 380-420 nm range, emits light of a different spectral characteristic. The nanophosphors together produce light in the fixture output that is at least substantially white and has a color rendering index (CRI) of 75 or higher. In some examples, the fixture optic includes an optical integrating cavity. In the examples using doped semiconductor nanophosphors, the visible white light output exhibits a color temperature in one of the following ranges along the black body curve: 2,725±145° Kelvin; 3,045±175° Kelvin; 3,465±245° Kelvin; and 3,985±275° Kelvin.

32 Claims, 10 Drawing Sheets

U.S. PATENT DOCUMENTS

| | | | |
|---|---|---|---|
| 5,914,487 | A | 6/1999 | Ramer et al. |
| 6,007,225 | A | 12/1999 | Ramer et al. |
| 6,222,623 | B1 | 4/2001 | Wetherell |
| 6,234,648 | B1 | 5/2001 | Borner et al. |
| 6,286,979 | B1 | 9/2001 | Ramer et al. |
| 6,357,889 | B1 | 3/2002 | Duggal et al. |
| 6,361,192 | B1 | 3/2002 | Fussell et al. |
| 6,422,718 | B1 | 7/2002 | Anderson et al. |
| 6,437,861 | B1 | 8/2002 | Kuta |
| 6,447,698 | B1 | 9/2002 | Ihara et al. |
| 6,473,554 | B1 | 10/2002 | Pelka et al. |
| 6,536,914 | B2 | 3/2003 | Hoelen et al. |
| 6,566,824 | B2 | 5/2003 | Panagotacos et al. |
| 6,692,136 | B2 | 2/2004 | Marshall et al. |
| 6,700,112 | B2 | 3/2004 | Brown |
| 6,734,465 | B1 | 5/2004 | Taskar et al. |
| 6,737,681 | B2 | 5/2004 | Koda |
| 6,836,083 | B2 | 12/2004 | Mukai |
| 6,869,545 | B2 | 3/2005 | Peng et al. |
| 6,872,249 | B2 | 3/2005 | Peng et al. |
| 6,960,872 | B2 | 11/2005 | Beeson et al. |
| 6,969,843 | B1 | 11/2005 | Beach et al. |
| 6,985,163 | B2 | 1/2006 | Riddle et al. |
| 6,995,355 | B2 | 2/2006 | Rains, Jr. et al. |
| 7,025,464 | B2 | 4/2006 | Beeson et al. |
| 7,029,935 | B2 | 4/2006 | Negley et al. |
| 7,040,774 | B2 | 5/2006 | Beeson et al. |
| 7,058,103 | B2 | 6/2006 | Ishida et al. |
| 7,102,152 | B2 | 9/2006 | Chua et al. |
| 7,105,051 | B2 | 9/2006 | Peng et al. |
| 7,144,131 | B2 | 12/2006 | Rains |
| 7,148,632 | B2 | 12/2006 | Berman et al. |
| 7,153,703 | B2 | 12/2006 | Peng et al. |
| 7,160,525 | B1 | 1/2007 | Peng et al. |
| 7,192,850 | B2 | 3/2007 | Chen et al. |
| 7,220,039 | B2 | 5/2007 | Ahn et al. |
| 7,235,190 | B1 | 6/2007 | Wilcoxon et al. |
| 7,235,792 | B2 | 6/2007 | Elofson |
| 7,259,400 | B1 | 8/2007 | Taskar |
| 7,273,904 | B2 | 9/2007 | Peng et al. |
| 7,350,933 | B2 | 4/2008 | Ng et al. |
| 7,374,807 | B2 | 5/2008 | Parce et al. |
| 7,481,553 | B2 | 1/2009 | Kim et al. |
| 7,531,149 | B2 | 5/2009 | Peng et al. |
| 7,560,677 | B2 | 7/2009 | Lyons et al. |
| 7,618,157 | B1 | 11/2009 | Galvez et al. |
| 7,768,192 | B2 | 8/2010 | Van De Ven et al. |
| 7,845,825 | B2 * | 12/2010 | Ramer et al. ............... 362/231 |
| 7,889,421 | B2 | 2/2011 | Narendran et al. |
| 8,016,470 | B2 | 9/2011 | Li et al. |
| 2004/0012027 | A1 | 1/2004 | Keller et al. |
| 2004/0135504 | A1 | 7/2004 | Tamaki et al. |
| 2004/0151008 | A1 | 8/2004 | Artsyukhovich et al. |
| 2004/0188594 | A1 | 9/2004 | Brown et al. |
| 2004/0257807 | A1 | 12/2004 | Endo et al. |
| 2005/0156103 | A1 | 7/2005 | May et al. |
| 2005/0161586 | A1 | 7/2005 | Rains et al. |
| 2006/0068154 | A1 * | 3/2006 | Parce et al. .................. 428/76 |
| 2006/0072314 | A1 | 4/2006 | Rains |
| 2006/0291226 | A1 | 12/2006 | Daicho et al. |
| 2007/0024173 | A1 | 2/2007 | Braune |
| 2007/0045524 | A1 | 3/2007 | Rains, Jr. et al. |
| 2007/0051883 | A1 | 3/2007 | Rains, Jr. et al. |
| 2007/0138978 | A1 | 6/2007 | Rains, Jr. et al. |
| 2007/0170454 | A1 | 7/2007 | Andrews |
| 2007/0235639 | A1 | 10/2007 | Rains, Jr. |
| 2007/0291505 | A1 | 12/2007 | Fortenberry et al. |
| 2008/0030974 | A1 | 2/2008 | Abu-Ageel |
| 2008/0084706 | A1 | 4/2008 | Roshan et al. |
| 2008/0094835 | A1 | 4/2008 | Marra et al. |
| 2008/0106887 | A1 | 5/2008 | Salsbury et al. |
| 2008/0224025 | A1 | 9/2008 | Lyons et al. |
| 2008/0237540 | A1 * | 10/2008 | Dubrow ................. 252/301.6 S |
| 2008/0246017 | A1 | 10/2008 | Gillies et al. |
| 2008/0291670 | A1 | 11/2008 | Rains |
| 2009/0002986 | A1 | 1/2009 | Medendorp, Jr. et al. |
| 2009/0003002 | A1 | 1/2009 | Sato |
| 2009/0251884 | A1 | 10/2009 | Rains |
| 2009/0290352 | A1 | 11/2009 | Wu et al. |
| 2009/0295266 | A1 | 12/2009 | Ramer et al. |
| 2009/0296368 | A1 | 12/2009 | Ramer |
| 2010/0002414 | A1 | 1/2010 | Meir et al. |
| 2011/0128718 | A1 | 6/2011 | Ramer et al. |
| 2011/0175546 | A1 | 7/2011 | Ramer et al. |
| 2011/0176289 | A1 | 7/2011 | Ramer et al. |
| 2011/0176316 | A1 * | 7/2011 | Phipps et al. ................. 362/373 |

FOREIGN PATENT DOCUMENTS

| | | | |
|---|---|---|---|
| WO | WO 2009/137053 | A1 | 11/2009 |
| WO | WO 2009/146261 | A1 | 12/2009 |
| WO | WO 2009/146262 | A1 | 12/2009 |
| WO | WO 2010/012999 | A2 | 2/2010 |

OTHER PUBLICATIONS

"Energy Star Program Requirements for Solid State Lighting Luminaires Eligibility Criteria—Version 1.0", Manual, Sep. 12, 2007.

Yin, Yadong and A. Paul Alivisatos, "Colloidal nanocrystal sythesis and the organic-inorganic interface", Insight Review, Sep. 25, 2005, pp. 664-670, Nature vol. 437.

"Final Report: Highly Bright, Heavy Metal-Free, and Stable Doped Semiconductor Nanophosphors for Economical Solid State Lighting Alternatives", Report, Nov. 12, 2009, pp. 1-3, National Center for Environmental Research, web publication.

"Solid-State Lighting: Development of White LEDs Using Nanophosphor-InP Blends", Report, Oct. 26, 2009, p. 1, U.S. Department of Energy—Energy Efficiency and Renewable Energy, web publication.

"Solid-State Lighting: Improved Light Extraction Efficiencies of White pc-LEDs for SSL by Using Non-Toxic, Non-Scattering, Bright, and Stable Doped ZnSe Quantum Dot Nanophosphors (Phase I)", Report, Oct. 26, 2009, pp. 1-2, U.S. Department of Energy—Energy Efficiency and Renewable Energy, web publication.

"Chemistry—All in the Dope", Editor's Choice, Dec. 9, 2005, Science, vol. 310, p. 1, AAAS, web publication.

"D-dots: Heavy Metal Free Doped Semiconductor Nanocrystals", Technical Specifications, etc. Dec. 1, 2009, pp. 1-2, NN-LABS, LLC (Nanomaterials & Nanofabrication Laboratories), CdSe/ZnS Semiconductor Nanocrystals, web publication.

International Search Report and Written Opinion of the International Searching Authority issued in International Patent Application No. PCT/US2010/028247, mailed May 19, 2010.

Entire Prosecution of U.S. Appl. No. 12/629,614 to Ramer, et al., filed Dec. 2, 2009, entitled "Light Fixture Using Near UV Solid State Device and Remote Semiconductor Nanophosphors to Produce White Light".

Transmittal of International Search Report and Written Opinion of the International Searching Authority issued in International Patent Application No. PCT/US2010/058716 dated May 24, 2011.

Transmittal of International Search Report and Written Opinion of the International Searching Authority issued in International Patent Application No. PCT/US2011/024783 dated May 31, 2011.

Transmittal of International Search Report and Written Opinion of the International Searching Authority issued in International Patent Application No. PCT/US2011/024789 dated May 27, 2011.

Transmittal of International Search Report and Written Opinion of the International Searching Authority issued in International Patent Application No. PCT/US2011024787 dated May 27, 2011.

United States Office Action issued in U.S. Appl. No. 12/729,582 dated Sep. 22, 2011.

United States Office Action issued in U.S. Appl. No. 12/729,542 dated Oct. 11, 2011.

United States Office Action, issued in U.S. Appl. No. 12/836,022, dated Jan. 26, 2012.

* cited by examiner

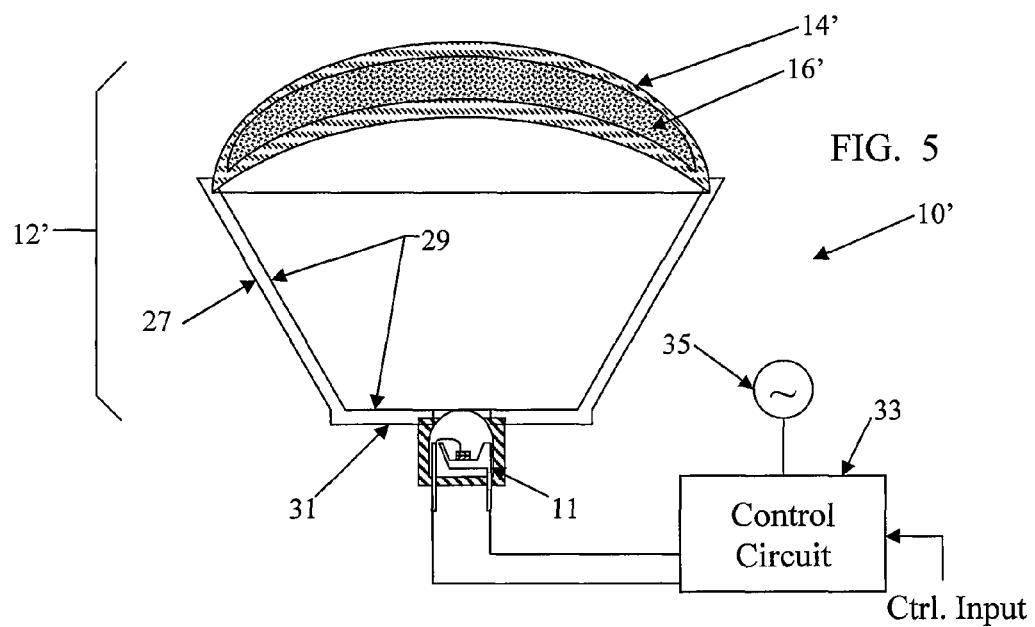
FIG. 5
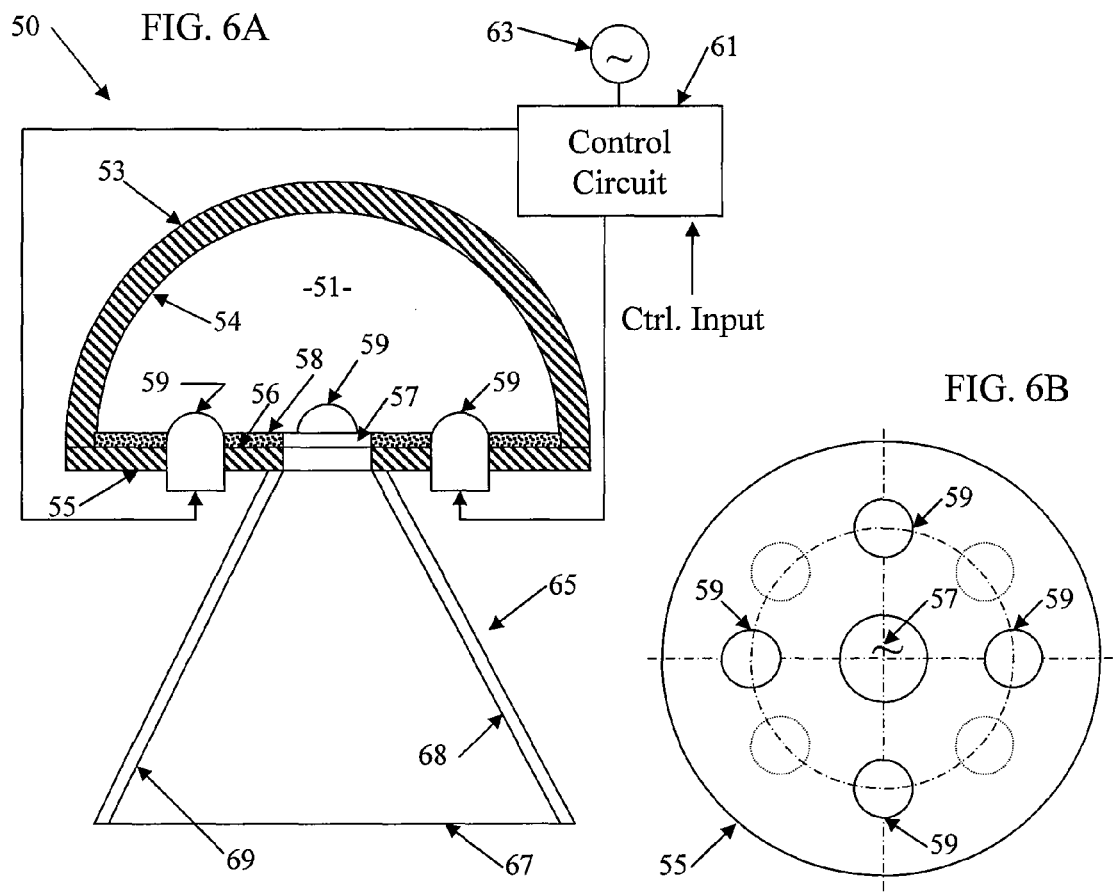
FIG. 6A
FIG. 6B

US 8,201,967 B2

LIGHT FIXTURE USING NEAR UV SOLID STATE DEVICE AND REMOTE SEMICONDUCTOR NANOPHOSPHORS TO PRODUCE WHITE LIGHT

This application is a Continuation of U.S. patent application Ser. No. 12/629,614, filed on Dec. 2, 2009, now U.S. Pat. No. 7,845,825, the disclosure of which is incorporated by reference herein.

TECHNICAL FIELD

The present subject matter relates to techniques, fixtures and systems to produce perceptible white light of a desirable color, for example general lighting applications, using energy in a range of 380-420 nm to pump semiconductor nanophosphors for converting such energy into visible white light, with a color rendering index (CRI) of 75 or higher, and for example exhibiting a color temperature in one of several specific disclosed regions along the black body curve which provide a desirable quality of white light for general lighting applications and the like.

BACKGROUND

As costs of energy increase along with concerns about global warming due to consumption of fossil fuels to generate energy, there is an every increasing need for more efficient lighting technologies. These demands, coupled with rapid improvements in semiconductors and related manufacturing technologies, are driving a trend in the lighting industry toward the use of light emitting diodes (LEDs) or other solid state light sources to produce light for general lighting applications, as replacements for incandescent lighting and eventually as replacements for other older less efficient light sources.

The actual solid state light sources, however, produce light of specific limited spectral characteristics. To obtain white light of a desired characteristic and/or other desirable light colors, one approach uses sources that produce light of two or more different colors or wavelengths and one or more optical processing elements to combine or mix the light of the various wavelengths to produce the desired characteristic in the output light. In recent years, techniques have also been developed to shift or enhance the characteristics of light generated by solid state sources using phosphors, including for generating white light using LEDs. Phosphor based techniques for generating white light from LEDs, currently favored by LED manufacturers, include UV or Blue LED pumped phosphors. In addition to traditional phosphors, semiconductor nanophosphors have been used more recently. The phosphor materials may be provided as part of the LED package (on or in close proximity to the actual semiconductor chip), or the phosphor materials may be provided remotely (e.g. on or in association with a macro optical processing element such as a diffuser or reflector outside the LED package). The remote phosphor based solutions have advantages, for example, in that the color characteristics of the fixture output are more repeatable, whereas solutions using sets of different color LEDs and/or lighting fixtures with the phosphors inside the LED packages tend to vary somewhat in light output color from fixture to fixture, due to differences in the light output properties of different sets of LEDs (due to lax manufacturing tolerances of the LEDs).

Although these solid state lighting technologies have advanced considerably in recent years, there is still room for further improvement. For example, there is always a need for techniques to still further improve efficiency of solid state lighting fixtures or systems, to reduce energy consumption. Also, for general lighting applications, it is desirable to consistently provide light outputs of acceptable characteristics (e.g. white light of a desired color rendering index and/or color temperature) in a consistent repeatable manner from one fixture to the next.

SUMMARY

The teachings herein provide further improvements over the existing technologies for providing light that is at least substantially white and address one or more of the stated needs. A semiconductor chip produces electromagnetic energy in a range of 380-420 nm, e.g. 405 nm which is in the near ultraviolet (UV). Remote semiconductor nanophosphors, typically doped semiconductor nanophosphors, are remotely positioned in an optic of a light fixture so as to be excited by this energy. Each phosphor is of a type or configuration such that when excited by energy in the 380-420 nm range, the semiconductor nanophosphors together produce light in the fixture output that is at least substantially white and has a color rendering index (CRI) of 75 or higher. In some examples, the fixture optic includes an optical integrating cavity. In several examples using doped semiconductor nanophosphors, output exhibits a color temperature in one of the following ranges along the black body curve: 2,725±145° Kelvin; 3,045±175° Kelvin; 3,465±245° Kelvin; and 3,985±275° Kelvin.

An example of a light fixture for a lighting application might include a near ultraviolet (UV) solid state source, containing a semiconductor chip for producing near UV electromagnetic energy in a range of 380-420 nm, and a macro optic outside and coupled to the near UV solid state source, for receiving and processing the near UV electromagnetic energy to produce a light output for the fixture. This fixture also includes a plurality of remote doped semiconductor nanophosphors associated with the macro optic and apart from the semiconductor chip. Each of the remote doped semiconductor nanophosphors is of a type excited in response to near UV electromagnetic energy in the range of 380-420 nm from the solid state source. Each of the remote doped semiconductor nanophosphors is of a type for re-emitting visible light of a different spectrum, having little or no overlap with absorption spectra of the nanophosphors. The remote doped semiconductor nanophosphors together produce visible light in the output for the fixture from the optic when excited.

The visible light in the output for the fixture produced by the near UV excitation of the remote doped semiconductor nanophosphors is at least substantially white. The visible light in the output for the fixture produced by the near UV excitation of the remote doped semiconductor nanophosphors has a color rendering index (CRI) of 75 or higher. Also, the visible light in the output for the fixture produced by near UV excitation of the remote doped semiconductor nanophosphors has a color temperature of one of the following ranges: 2,725±145° Kelvin; 3,045±175° Kelvin; 3,465±245° Kelvin; and 3,985±275° Kelvin.

In specific examples, the semiconductor chip of the near UV solid state source is configured for producing electromagnetic energy of 405 nm. The remote phosphors include a doped semiconductor nanophosphor of a type excited in response to near UV electromagnetic energy in the range of 380-420 nm for re-emitting orange light; a doped semiconductor nanophosphor of a type excited in response to near UV electromagnetic energy in the range of 380-420 nm for re-emitting blue light; and a doped semiconductor nanophosphor of a type excited in response to near UV electromagnetic energy in the range of 380-420 nm for re-emitting green light. In such a case, the visible light output produced during the near UV excitation of the doped semiconductor nanophosphors has a CRI of at least 80. A semiconductor nanophosphor of a type for re-emitting yellowish-green or greenish-yellow light may be added to further increase the CRI.

In another example, the remote doped semiconductor nanophosphors include red, green, blue and yellow emitting nanophosphors, excited in response to near UV electromagnetic energy in the range of 380-420 nm. In such a case, the visible light output produced during the near UV excitation of the doped semiconductor nanophosphors has a CRI of at least 88.

The near UV pumping of semiconductor nanophosphors to produce high quality white light can be implemented in a wide variety of different light fixture configurations. Several fixture structures are disclosed in the detailed description, by way of examples. In several cases, the optic of the fixture provides an optical integrating cavity.

From a somewhat different perspective, the present application discloses a light fixture for a general lighting application, which includes near ultraviolet (UV) solid state source, each containing a semiconductor chip for producing near UV electromagnetic energy in a range of 380-420 nm. A reflector has at least one reflective surface forming an optical integrating cavity. A light transmissive structure fills the optical integrating cavity, at least substantially. A portion of a surface of the light transmissive solid forms an optical aperture of the optical integrating cavity to allow emission of light from the cavity for a light output of the device. The light transmissive structure is coupled to the solid state sources to receive the near UV electromagnetic energy from the solid state sources, in a manner such that at least substantially all direct emissions from the semiconductor chips reflect at least once within the cavity. The fixture also includes a material associated with the light transmissive structure and apart from the semiconductor chips to receive electromagnetic energy from the semiconductor chips, which includes a plurality of semiconductor nanophosphors. Each of the semiconductor nanophosphors is of a type excited in response to near UV electromagnetic energy in the range of 380-420 nm from the solid state source. Each of the semiconductor nanophosphors is of a type for re-emitting visible light of a different spectrum having little or no overlap with absorption ranges of the nanophosphors. The semiconductor nanophosphors together produce visible light in the output for the fixture from the cavity aperture when excited. The visible light output for the fixture from the cavity produced by the excitation of the semiconductor nanophosphors is at least substantially white and has a color rendering index (CRI) of 75 or higher.

In a specific example, the semiconductor nanophosphors are doped semiconductor nanophosphors, such as the types discussed above. Such a fixture implementation can produce white light in one of the four specified color temperature ranges. The solid state source may be positioned and oriented relative to the light transmissive structure so that any near UV electromagnetic energy reaching the optical aperture surface of the light transmissive structure directly from the solid state source impacts the optical aperture surface at a sufficiently small angle as to be reflected back into the optical integrating cavity by total internal reflection at the optical aperture surface of the light transmissive structure.

In the fixture examples using a cavity and a light transmissive structure filling the structure, the material containing the nanophosphors may be deployed in a variety of different ways/locations. For example, the material containing the semiconductor nanophosphors may be located at or near the optical aperture surface of the light transmissive structure. In another example, a portion of the volume of the light transmissive structure contains the material containing the semiconductor nanophosphors. Several containment techniques are disclosed. For example, if the material is a liquid, the semiconductor nanophosphors are dispersed in the liquid, and the liquid is contained within the light transmissive structure.

The near UV pumping of remotely deployed semiconductor nanophosphors provides a relatively efficient mechanism to produce the desired white light output. Details of several of the remote semiconductor nanophosphor examples may further improve the efficiency of the light generation, at the fixture level. The selection of the parameters of the UV energy for pumping the semiconductor nanophosphors, and the selection of the phosphors to emit light having CRI in the specified range and a color temperature in one of the particular ranges provides white light that is highly useful, desirable and acceptable, particularly for many general lighting applications. Where the phosphors are provided remotely in the fixture, the white light characteristic tends to be very similar from one fixture to the next, with little or no humanly perceptible variation between fixtures of similar specifications and/or using similarly rated solid state sources.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The drawing figures depict one or more implementations in accord with the present teachings, by way of example only, not by way of limitation. In the figures, like reference numerals refer to the same or similar elements.

FIG. 5 illustrates an example of a white light emitting system, similar to that of FIG. 1, but using a different configuration/position for the container for the doped semiconductor nanophosphor material.

FIG. 6A illustrates an example of a white light emitting system, which utilizes a plurality of LED type sources and uses an optical integrating cavity and a deflector as parts of the optic, with certain elements thereof shown in cross-section.

FIG. 6B is an interior view of the LEDs and aperture of the cavity in the optic of the system of FIG. 6A.

DETAILED DESCRIPTION

Figure 1:
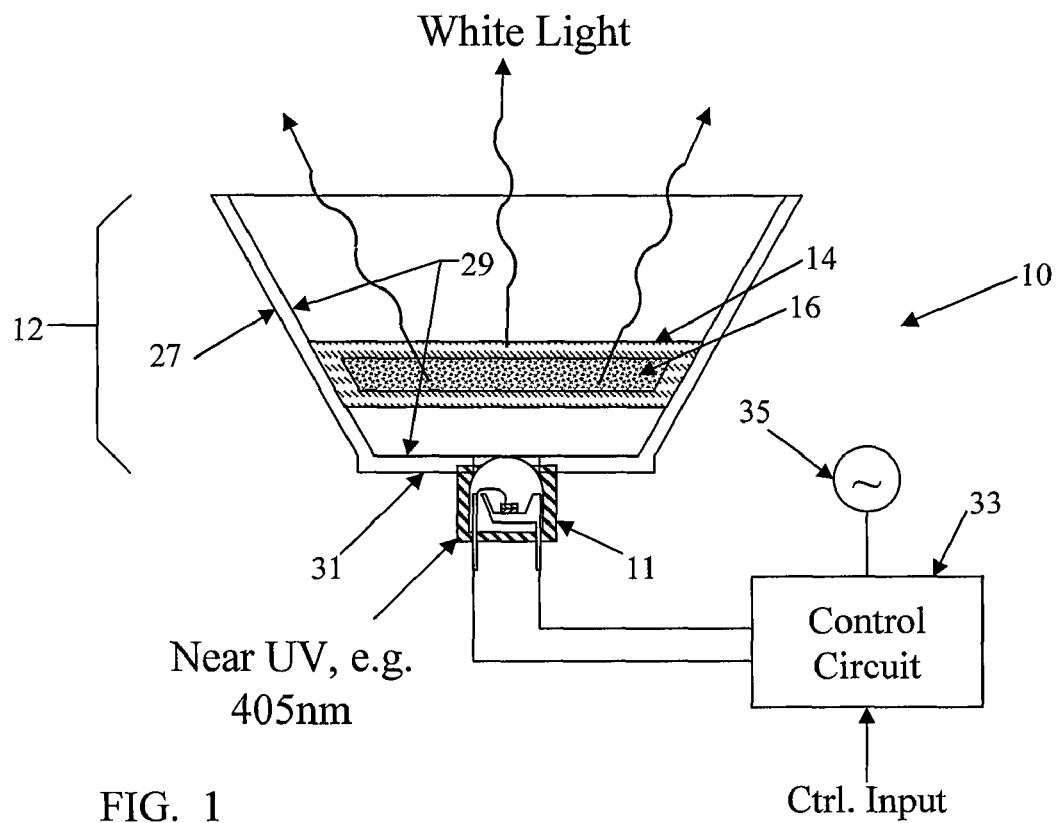
FIG. 1 illustrates an example of a white light emitting system, with certain elements thereof shown in cross-section.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

The various lighting systems, light fixtures and associated light generation techniques disclosed herein relate to efficient generation and output of visible white light of characteristics that are highly desirable in general lighting applications, for example, for illumination of spaces or areas to be inhabited by people or of objects in or around such areas. For such general white light applications, at least one semiconductor chip produces electromagnetic energy in a range of 380-420 nm, which is a portion of the "near ultraviolet" or "near UV" part of the electromagnetic energy spectrum. Several examples use a near UV LED type semiconductor chip rated to produce electromagnetic energy at 405 nm. Semiconductor nanophosphors, typically doped semiconductor nanophosphors, are remotely positioned in an optic of a light fixture, for example, at a remote location in or around a macro optical element (optic) such as a window, a light transmissive plate, a reflector, diffuser, an optical integrating cavity, etc. of the light fixture. Although in most of the specific examples, the optic includes at least one reflector, the term "optic" is meant to broadly encompass a wide variety of macro optical elements that may be coupled, alone or in combination with other macro elements, to process electromagnetic energy supplied by the solid state source(s).

Each of the phosphors is of a type or configuration excitable by the near UV energy in the 380-420 nm range to produce visible light of a different spectral characteristic, having little or no overlap with spectral absorption ranges of the nanophosphors. When excited together, the nanophosphors emit light for inclusion in the fixture output, and the combined visible light output is at least substantially white and has a color rendering index (CRI) of 75 or higher. Although sometimes referred to below simply as white light for convenience, the light produced by near UV excitation of the semiconductor nanophosphor is "at least substantially" white in that it appears as visible white light to a human observer, although it may not be truly white in the electromagnetic sense in that it may exhibit some spikes or peaks and/or valleys or gaps across the relevant portion of the visible spectrum.

The CIE color rendering index or "CRI" is a standardized measure of the ability of a light source to reproduce the colors of various objects, based on illumination of standard color targets by a source under test for comparison to illumination of such targets by a reference source. CRI, for example, is currently used as a metric to measure the color quality of white light sources for general lighting applications. Presently, CRI is the only accepted metric for assessing the color rendering performance of light sources. However, it has been recognized the CRI has drawbacks that limit usefulness in assessing the color quality of light sources, particularly for LED based lighting products. NIST has recently been work on a Color Quality Scale (CQS) as an improved standardized metric for rating the ability of a light source to reproduce the colors of various objects. The color quality of the white light produced by the systems discussed herein are specified in terms of CRI, as that is the currently available/accepted metric. Those skilled in the art will recognize, however, that the systems may be rated in future by corresponding high measures of the quality of the white light outputs using appropriate values on the CQS once that scale is accepted as an appropriate industry standard. Of course, other even more accurate metrics for white light quality measurement may be developed in future.

In examples that utilize doped semiconductor nanophosphors, the light output produced during the excitation of the semiconductor nanophosphors exhibits a color temperature that will preferably be in one of the following specific ranges along the black body curve: 2,725±145° Kelvin; 3,045±175° Kelvin; 3,465±245° Kelvin; and 3,985±275° Kelvin. These color temperature ranges correspond to nominal color temperature values of 2,700° Kelvin, 3,000° Kelvin, 3,500° Kelvin and 4,000° Kelvin, respectively. Color temperature in each of these particular ranges, for example, is highly useful, desirable and acceptable for many general lighting applications.

Before discussing structural examples, it may be helpful to discuss the types of phosphors of interest here. Semiconductor nanophosphors are nano-scale crystals or "nanocrystals" formed of semiconductor materials, which exhibit phosphorescent light emission in response to excitation by electromagnetic energy of an appropriate input spectrum (excitation or absorption spectrum). Examples of such nanophosphors include quantum dots (q-dots) formed of semiconductor materials. Like other phosphors, quantum dots and other semiconductor nanophosphors absorb light of one wavelength band and re-emit light at a different band of wavelengths. However, unlike conventional phosphors, optical properties of the semiconductor nanophosphors can be more easily tailored, for example, as a function of the size of the nanocrystals. In this way, for example, it is possible to adjust the absorption spectrum and/or the emission spectrum of the semiconductor nanophosphors by controlling crystal formation during the manufacturing process so as to change the size of the nanocrystals. For example, nanocrystals of the same material, but with different sizes, can absorb and/or emit light of different colors. For at least some semiconductor nanophosphor materials, the larger the nanocrystals, the redder the spectrum of re-emitted light; whereas smaller nanocrystals produce a bluer spectrum of re-emitted light.

Doped semiconductor nanophosphors are somewhat similar in that they are nanocrystals formed of semiconductor materials. However, this later type of semiconductor phosphors are doped, for example, with a transition metal or a rare earth metal. The doped semiconductor nanophosphors used in the exemplary solid state light emitting devices discussed herein are configured to convert energy in the near UV range of 380-420 nm into wavelengths of light, which together result in high CRI visible white light emission.

Semiconductor nanophosphors, including doped semiconductor nanocrystal phosphors, may be grown by a number of techniques. For example, colloidal nanocrystals are solution-grown, although non-colloidal techniques are possible.

In practice, a material containing or otherwise including doped semiconductor nanophosphors, of the type discussed in the examples herein, would contain several different types of doped semiconductor nanocrystals sized and/or doped so as to be excited by the near UV light energy. The different types of nanocrystals (e.g. semiconductor material, crystal size and/or doping properties) in the mixture are selected by their emission spectra, so that together the excited nanophosphors provides the high CRI white light of a rated color temperature when all are excited by the near UV light energy. Relative proportions in the mixture may also be chosen to help produce the desired output spectra.

Doped semiconductor nanophosphors exhibit a relatively large Stokes shift, from lower wavelength of absorption spectra to higher wavelength emissions spectra. In our examples, each of the phosphors is of a type excited in response to near UV electromagnetic energy in the range of 380-420 nm. Each type of nanophosphor re-emits visible light of a different spectral characteristic, and each of the phosphor emission spectra has little or no overlap with excitation or absorption ranges of the nanophosphors. Because of the magnitudes of the shifts, the emissions are substantially free of any overlap with the absorption spectra of the phosphors, and re-absorption of light emitted by the phosphors can be reduced or eliminated, even in applications that use a mixture of a number of such phosphors to stack the emission spectra thereof so as to provide a desired spectral characteristic in the combined light output.

Reference now is made in detail to the examples illustrated in the accompanying drawings and discussed below. FIG. 1 is a simplified illustration of a lighting system 10, for emitting visible, substantially white light, so as to be perceptible by a person. A fixture portion of the system is shown in cross-section (although some cross-hatching thereof has been omitted for ease of illustration). The circuit elements are shown in functional block form. The system 10 utilizes a solid state source 11, for emitting electromagnetic energy of a wavelength in the near UV range, in this case in the 380-420 nm range. Of course, there may be any number of solid state sources 11, as deemed appropriate to produce the desired level of output for the system 10 for any particular intended lighting application.

The solid state source 11 is a semiconductor based structure for emitting the near UV electromagnetic energy. The structure includes a semiconductor chip, such as a light emitting diode (LED), a laser diode or the like, within a package or enclosure. A glass or plastic portion of the package that encloses the chip allows for emission of the near UV electromagnetic energy in the desired direction. Many such source packages include internal reflectors to direct energy in the desired direction and reduce internal losses. To provide readers a full understanding, it may help to consider a simplified example of the structure of such a near UV solid state source 11.

Figure 2:
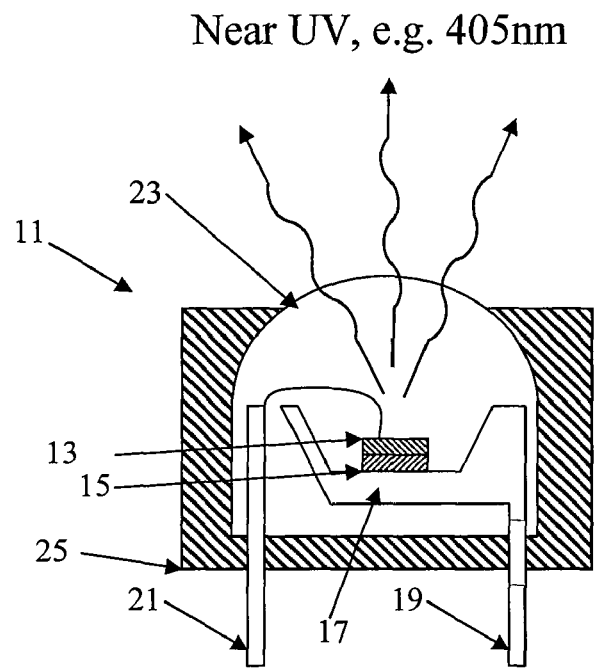
FIG. 2 is a simplified cross-sectional view of a light-emitting diode (LED) type solid state source, in this case, for emitting near UV electromagnetic energy, which may be used as the source in the system of FIG. 1.

FIG. 2 illustrates a simple example of a near UV LED type solid state source 11, in cross section. In the example of FIG. 2, the source 11 includes at least one semiconductor chip, each comprising two or more semiconductor layers 13, 15 forming the actual LED. The semiconductor layers 13, 15 of the chip are mounted on an internal reflective cup 17, formed as an extension of a first electrode, e.g. the cathode 19. The cathode 19 and an anode 21 provide electrical connections to layers of the semiconductor chip device within the packaging for the source 11. In the example, an epoxy dome 23 (or similar transmissive part) of the enclosure allows for emission of the electromagnetic energy from the chip in the desired direction.

In this simple example, the near UV solid state source 11 also includes a housing 25 that completes the packaging/enclosure for the source. Typically, the housing 25 is metal, e.g. to provide good heat conductivity so as to facilitate dissipation of heat generated during operation of the LED. Internal "micro" reflectors, such as the reflective cup 17, direct energy in the desired direction and reduce internal losses. Although one or more elements in the package, such as the reflector 17 or dome 23 may be doped or coated with phosphor materials, phosphor doping integrated in (on or within) the package is not required for remote semiconductor nanophosphor implementations as discussed herein. The point here at this stage of our discussion is that the solid state source 11 is rated to emit near UV electromagnetic energy of a wavelength in the 380-420 nm range, such as 405 nm in the illustrated example.

Semiconductor devices such as the solid state source 11 exhibit emission spectra having a relatively narrow peak at a predominant wavelength, although some such devices may have a number of peaks in their emission spectra. Often, manufacturers rate such devices with respect to the intended wavelength of the predominant peak, although there is some variation or tolerance around the rated value, from device to device. Solid state light source devices such as device 11 for use in a lighting system 10 will have a predominant wavelength in the 380-420 nm range. For example, the solid state source 11 in the examples of FIGS. 1 and 2 is rated for a 405 nm output, which means that it has a predominant peak in its emission spectra at or about 405 nm (within the manufacturer's tolerance range of that rated wavelength value). The system 10, however, may use devices that have additional peaks in their emission spectra.

The structural configuration of the solid state source 11 shown in FIG. 2 is presented here by way of example only. Those skilled in the art will appreciate that the system 10 can utilize any solid state light emitting device structure, where the device is configured as a source of 380-420 nm near UV range electromagnetic energy, for example, having substantial energy emissions in that range such as a predominant peak at or about 405 nm.

Returning to FIG. 1, the system 10 utilizes a macro scale optic 12 together with the solid state source 11 to form a light fixture. The light fixture could be configured for a general lighting application. Examples of general lighting applications include downlighting, task lighting, "wall wash" lighting, emergency egress lighting, as well as illumination of an object or person in a region or area intended to be occupied by one or more people. A task lighting application, for example, typically requires a minimum of approximately 20 foot-candles (fcd) on the surface or level at which the task is to be performed, e.g. on a desktop or countertop. In a room, where the light fixture is mounted in or hung from the ceiling or wall and oriented as a downlight, for example, the distance to the task surface or level can be 35 inches or more below the output of the light fixture. At that level, the light intensity will still be 20 fcd or higher for task lighting to be effective. Of course, the fixture (11, 12) of FIG. 1 may be used in other applications, such as vehicle headlamps, flashlights, etc.

The macro scale optical processing element or 'optic' 12 in this first example includes a macro (outside the packaging of source 11) scale reflector 27. The reflector 27 has a reflective surface 29 arranged to receive at least some electromagnetic energy from the solid state source 11 and/or a remote semiconductor nanophosphor material 16. The disclosed system 10 may use a variety of different structures or arrangements for the reflector 27. For efficiency, the reflective surface 29 of the reflector 27 should be highly reflective. The reflective surface 29 may be specular, semi or quasi specular, or diffusely reflective.

In the example, the emitting region of the solid state source 11 fits into or extends through an aperture in a proximal section 31 of the reflector 27. The solid state source 11 may be coupled to the reflector 27 in any manner that is convenient and/or facilitates a particular lighting application of the system 10. For example, the source 11 may be within the volume of the reflector 27, the source may be outside of the reflector (e.g. above the reflector in the illustrated orientation) and facing to emit near UV light energy into the interior of the reflector, or the electromagnetic energy may be coupled from the solid source 11 to the reflector 27 via a light guide or pipe or by an optical fiber. However, close efficient coupling is preferable.

The macro optic 12 will include or have associated therewith remote semiconductor nanophosphors. Although associated with the optic, the phosphors are located apart from the semiconductor chip of the source or sources 11 used in the particular system 10. For that purpose, in the first system 10, the optic 12 also includes a container 14 holding a material 16 that contains semiconductor nanophosphors.

The semiconductor nanophosphors may be provided in the form of an ink, paint or other form of coating formed by a suitable binder and semiconductor nanophosphor particles. Alternatively, the material 16 may take the form of a liquid within which the semiconductor nanophosphor particles are dispersed. The medium preferably exhibits high transmissivity and/or low absorption to light of the relevant wavelengths, although it may be transparent or somewhat translucent. Although alcohol, oils (synthetic, vegetable or other oils) or other media may be used, in the example of FIG. 1, the medium may be a silicon material. If silicone is used, it may be in gel form or cured into a hardened form in the finished light fixture product. The material forming the walls of the container 14 also may exhibit high transmissivity and/or low absorption to light of the relevant wavelengths. The walls of the container 14 may be smooth and highly transparent or translucent, and/or one or more surfaces may have an etched or roughened texture.

As outlined above, the semiconductor nanophosphors in the material shown at 16 are of types or configurations (e.g. selected types of doped semiconductor nanophosphors) excitable by the near UV energy from the solid state source 11. Together, the excited nanophosphors produce output light that is at least substantially white and has a color rendering index (CRI) of 75 or higher. The fixture output light produced by this near UV excitation of the semiconductor nanophosphors exhibits color temperature in one of the desired ranges along the black body curve. In the examples, the phosphors are doped semiconductor nanophosphors. Different light fixtures or systems designed for different color temperatures of white output light would use different formulations of mixtures of doped semiconductor nanophosphors. The white output light of the fixture exhibits color temperature in one of the four specific ranges along the black body curve listed in Table 1 below. The solid state lighting system 11 could use a variety of different combinations of semiconductor nanophosphors to produce such an output. Examples of suitable materials, having the nanophosphor(s) in a silicone medium, are available from NN Labs of Fayetteville, Ark.

TABLE 1

Nominal Color Temperatures and Corresponding Color Temperature Ranges

| Nominal Color Temp. (° Kelvin) | Color Temp. Range (° Kelvin) |
| --- | --- |
| 2700 | 2725 ± 145 |
| 3000 | 3045 ± 175 |
| 3500 | 3465 ± 245 |
| 4000 | 3985 ± 275 |

In Table 1, the nominal color temperature values represent the rated or advertised temperature as would apply to particular lighting fixture or system products having an output color temperature within the corresponding ranges.

Figure 1A:
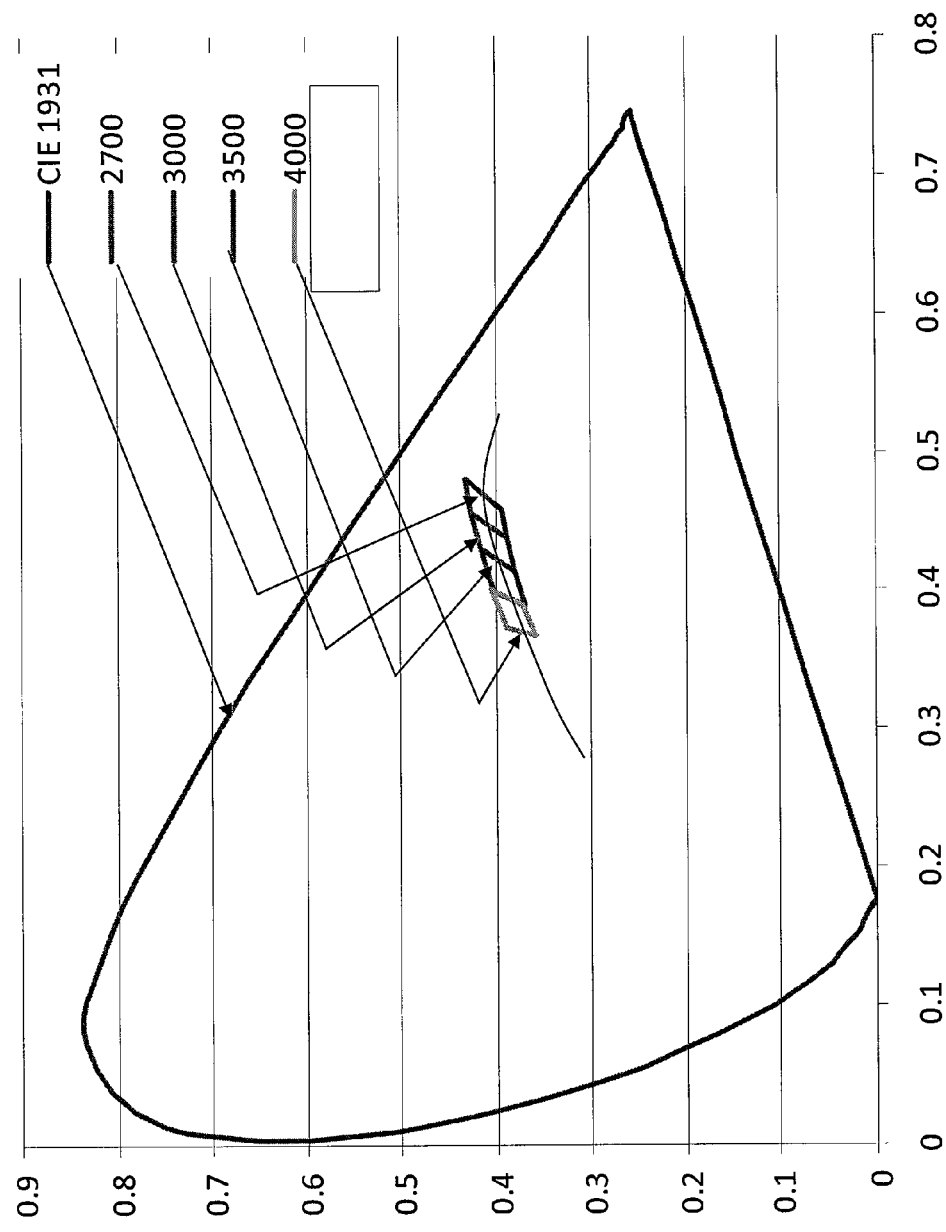
FIG. 1A is a color chart showing the black body curve and tolerance quadrangles along that curve for chromaticities corresponding to the desired color temperature ranges.

The color temperature ranges fall along the black body curve. FIG. 1A shows the outline of the CIE 1931 color chart, and the curve across a portion of the chart represents a section of the black body curve that includes the desired CIE color temperature (CCT) ranges. The light may also vary somewhat in terms of chromaticity from the coordinates on the black body curve. The quadrangles shown in the drawing represent the range of chromaticity for each nominal CCT value. Each quadrangle is defined by the range of CCT and the distance from the black body curve.

Table 2 below provides a chromaticity specification for each of the four color temperature ranges. The x, y coordinates define the center points on the black body curve and the vertices of the tolerance quadrangles diagrammatically illustrated in the color chart of FIG. 1A.

TABLE 2

| Chromaticity Specification for the Four Nominal Values/CCT Ranges | | | | | | | | |
|---|---|---|---|---|---|---|---|---|
| CCT Range | | | | | | | | |
| 2725 ± 145 | | 3045 ± 175 | | 3465 ± 245 | | 3985 ± 275 | | |
| Nominal CCT | | | | | | | | |
| 2700° K | | 3000° K | | 3500° K | | 4000° K | | |
| | x | y | x | y | x | y | x | y |
| Center point | 0.4578 | 0.4101 | 0.4338 | 0.4030 | 0.4073 | 0.3917 | 0.3818 | 0.3797 |
| | 0.4813 | 0.4319 | 0.4562 | 0.4260 | 0.4299 | 0.4165 | 0.4006 | 0.4044 |
| Tolerance | 0.4562 | 0.426 | 0.4299 | 0.4165 | 0.3996 | 0.4015 | 0.3736 | 0.3874 |
| Quadrangle | 0.4373 | 0.3893 | 0.4147 | 0.3814 | 0.3889 | 0.369 | 0.367 | 0.3578 |
| | 0.4593 | 0.3944 | 0.4373 | 0.3893 | 0.4147 | 0.3814 | 0.3898 | 0.3716 |

Figure 3:
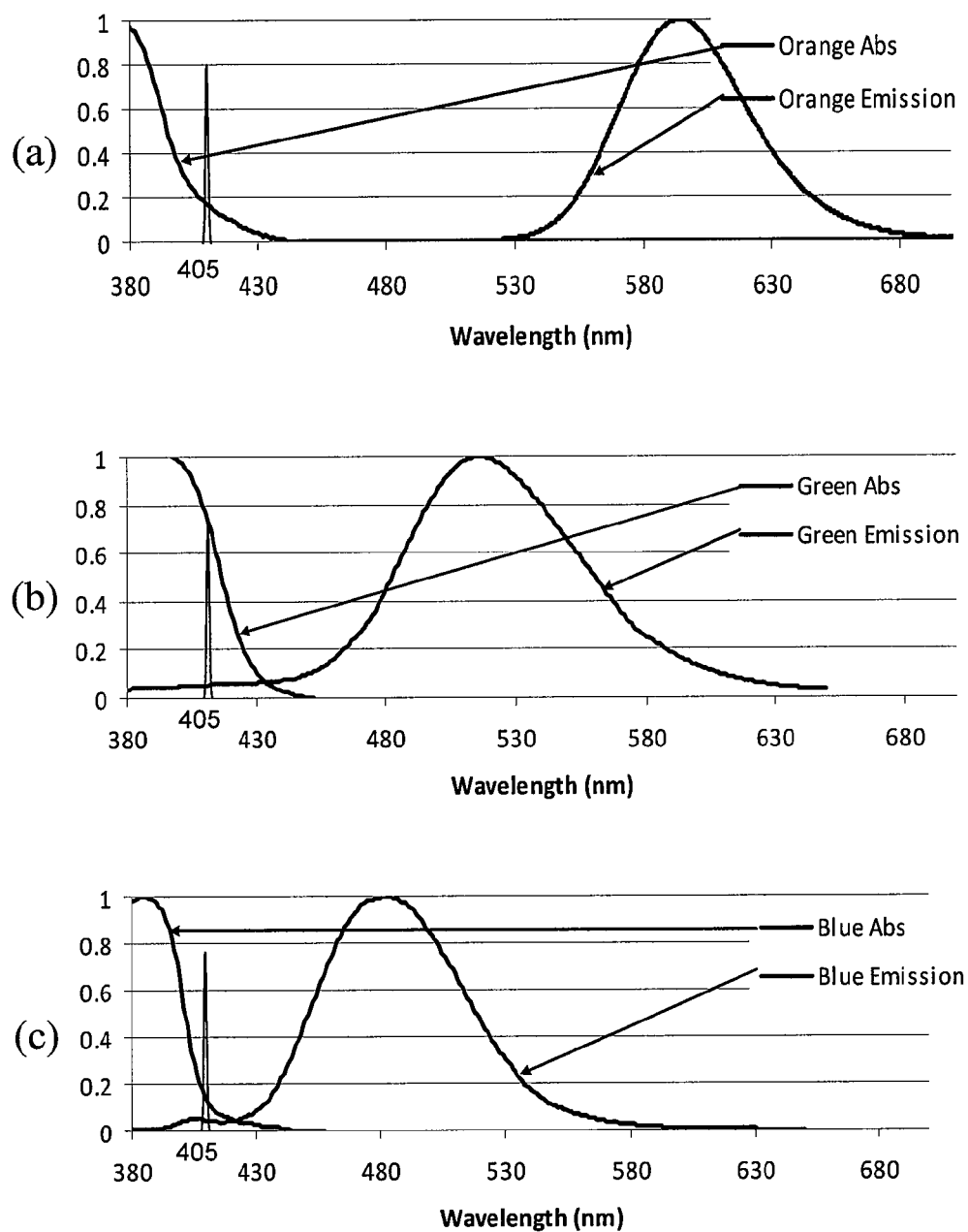
FIG. 3 is a graph of absorption and emission spectra of a number of doped semiconductor nanophosphors.

Doped semiconductor nanophosphors exhibit a large Stokes shift, that is to say from a short-wavelength range of absorbed energy up to a fairly well separated longer-wavelength range of emitted light. FIG. 3 shows the absorption and emission spectra of three examples of doped semiconductor nanophosphors. Each line of the graph also includes an approximation of the emission spectra of the 405 nm LED chip, to help illustrate the relationship of the 405 nm LED emissions to the absorption spectra of the exemplary doped semiconductor nanophosphors. The illustrated spectra are not drawn precisely to scale but in a manner to provide a teaching example to illuminate our discussion here.

The top line (a) of the graph shows the absorption and emission spectra for an orange emitting doped semiconductor nanophosphor. The absorption spectrum for this first phosphor includes the 380-420 nm near UV range, but that absorption spectrum drops substantially to 0 before reaching 450 nm. As noted, the phosphor exhibits a large Stokes shift from the short wavelength(s) of absorbed light to the longer wavelengths of re-emitted light. The emission spectrum of this first phosphor has a fairly broad peak in the wavelength region humans perceive as orange. Of note, the emission spectrum of this first phosphor is well above the illustrated absorption spectra of the other doped semiconductor nanophosphors and well above its own absorption spectrum. As a result, orange emissions from the first doped semiconductor nanophosphor would not re-excite that phosphor and would not excite the other doped semiconductor nanophosphors if mixed together. Stated another way, the orange phosphor emissions would be subject to little or no phosphor re-absorption, even in mixtures containing one or more of the other doped semiconductor nanophosphors.

The next line (b) of the graph in FIG. 3 shows the absorption and emission spectra for a green emitting doped semiconductor nanophosphor. The absorption spectrum for this second phosphor includes the 380-420 nm near UV range, but that absorption spectrum drops substantially to 0 a little below 450 nm. This phosphor also exhibits a large Stokes shift from the short wavelength(s) of absorbed light to the longer wavelengths of re-emitted light. The emission spectrum of this second phosphor has a broad peak in the wavelength region humans perceive as green. Again, the emission spectrum of the phosphor is well above the illustrated absorption spectra of the other doped semiconductor nanophosphors and well above its own absorption spectrum. As a result, green emissions from the second doped semiconductor nanophosphor would not re-excite that phosphor and would not excite the other doped semiconductor nanophosphors if mixed together. Stated another way, the green phosphor emissions also should be subject to little or no phosphor re-absorption, even in mixtures containing one or more of the other doped semiconductor nanophosphors.

The bottom line (c) of the graph shows the absorption and emission spectra for a blue emitting doped semiconductor nanophosphor. The absorption spectrum for this third phosphor includes the 380-420 nm near UV range, but that absorption spectrum drops substantially to 0 between 400 and 450 nm. This phosphor also exhibits a large Stokes shift from the short wavelength(s) of absorbed light to the longer wavelengths of re-emitted light. The emission spectrum of this third phosphor has a broad peak in the wavelength region humans perceive as blue. The main peak of the emission spectrum of the phosphor is well above the illustrated absorption spectra of the other doped semiconductor nanophosphors and well above its own absorption spectrum. In the case of the blue example, there is just a small amount of emissions in the region of the phosphor absorption spectra. As a result, blue emissions from the third doped semiconductor nanophosphor would re-excite that phosphor at most a minimal amount. As in the other phosphor examples of FIG. 3, the blue phosphor emissions would be subject to relatively little phosphor re-absorption, even in mixtures containing one or more of the other doped semiconductor nanophosphors.

Examples of suitable orange, green and blue emitting doped semiconductor nanophosphors of the types generally described above relative to FIG. 3 are available from NN Labs of Fayetteville, Ark.

As explained above, the large Stokes shift results in negligible re-absorption of the visible light emitted by doped semiconductor nanophosphors. This allows the stacking of multiple phosphors. It becomes practical to select and mix two, three or more such phosphors in a manner that produces a particular desired spectral characteristic in the combined light output generated by the phosphor emissions.

Figure 4A:
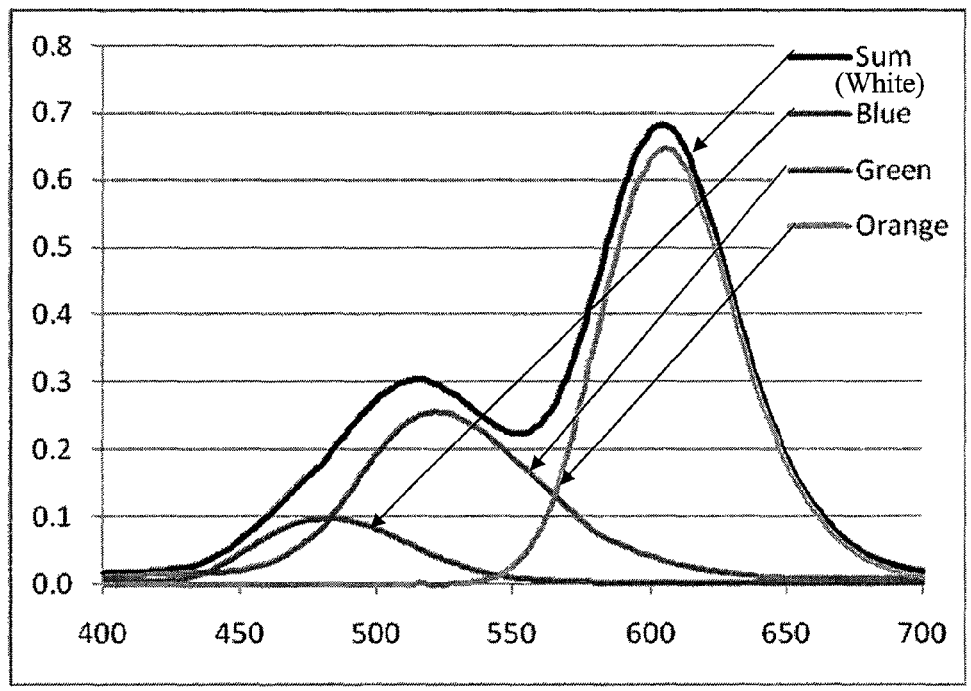
FIG. 4A is a graph of emission spectra of three of the doped semiconductor nanophosphors selected for use in an exemplary solid state light emitting device as well as the spectrum of the white light produced by combining the spectral emissions from those three phosphors.

FIG. 4A graphically depicts emission spectra of three of the doped semiconductor nanophosphors selected for use in an exemplary solid state light fixture as well as the spectrum of the white light produced by summing or combining the spectral emissions from those three phosphors. For convenience, the emission spectrum of the LED has been omitted from FIG. 4A, on the assumption that a high percentage of the 405 nm light from the LED is absorbed by the phosphors. Although the actual output emissions from the fixture may include some near UV light from the LED, the contribution thereof if any to the sum in the output spectrum should be relatively small.

Although other combinations are possible based on the phosphors discussed above relative to FIG. 3 or based on other semiconductor nanophosphor materials, the example of FIG. 4A represents emissions of blue, green and orange phosphors. The emission spectra of the blue, green and orange emitting doped semiconductor nanophosphors are similar to those of the corresponding color emissions shown in FIG. 3. Light is additive. Where the solid state fixture in system 10 includes the blue, green and orange emitting doped semiconductor nanophosphors as shown for example at 27 in FIG. 1, the addition of the blue, green and orange emissions produces a combined spectrum as approximated by the top or 'Sum' curve in the graph of FIG. 4A.

It is possible to add one or more additional nanophosphors, e.g. a fourth, fifth, etc., to the mixture to further improve the CRI. For example, to improve the CRI of the nanophosphor mix of FIGS. 3 and 4A, a doped semiconductor nanophosphor might be added to the mix with a broad emissions spectrum that is yellowish-green or greenish-yellow, that is to say with a peak of the phosphor emissions somewhere in the range of 540-570 nm, say at 555 nm.

Figure 4B:
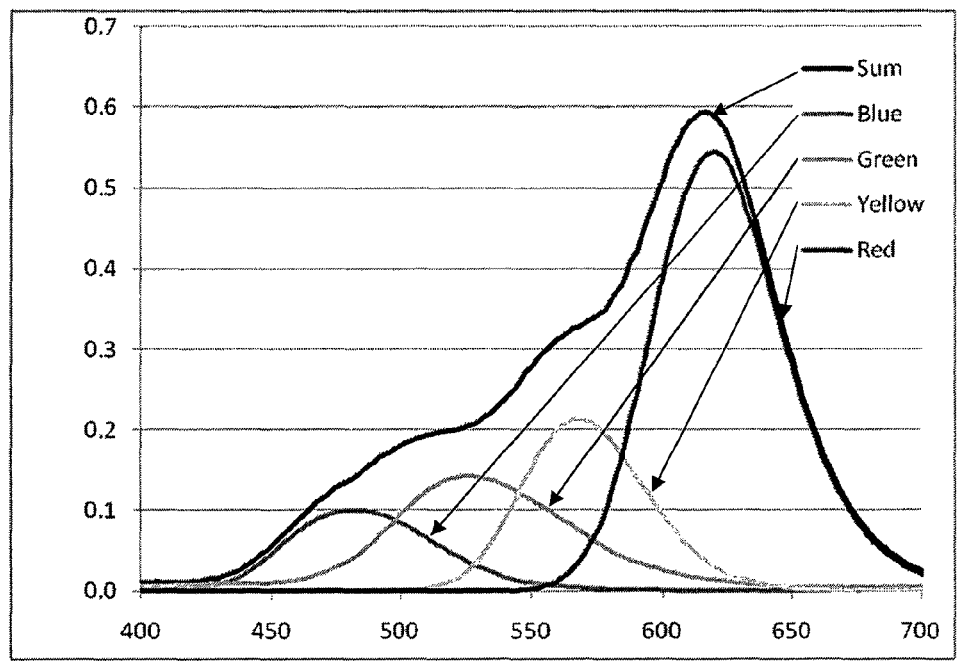
FIG. 4B is a graph of emission spectra of four doped semiconductor nanophosphors, in this case, for red, green, blue and yellow emissions, as the spectrum of the white light produced by combining the spectral emissions from those four phosphors.

Other mixtures also are possible, with two, three or more doped semiconductor nanophosphors. The example of FIG. 4B uses red, green and blue emitting semiconductor nanophosphors, as well as a yellow fourth doped semiconductor nanophosphor. Although not shown, the absorption spectra would be similar to those of the three nanophosphors discussed above relative to FIG. 3. For example, each absorption spectrum would include at least a portion of the 380-420 nm near UV range. All four phosphors would exhibit a large Stokes shift from the short wavelength(s) of absorbed light to the longer wavelengths of re-emitted light, and thus their emissions spectra have little or not overlap with the absorption spectra.

In this example (FIG. 4B), the blue nanophosphor exhibits an emission peak at or around 484, nm, the green nanophosphor exhibits an emission peak at or around 516 nm, the yellow nanophosphor exhibits an emission peak at or around 580, and the red nanophosphor exhibits an emission peak at or around 610 nm. The addition of these blue, green, red and yellow phosphor emissions produces a combined spectrum as approximated by the top or 'Sum' curve in the graph of FIG. 4B. The 'Sum' curve in the graph represents a resultant white light output having a color temperature of 2600° Kelvin (within the 2,725±145° Kelvin range), where that white output light also would have a CRI of 88 (higher than 75).

Various mixtures of doped semiconductor nanophosphors will produce white light emissions from solid state fixtures 10 that exhibit CRI of 75 or higher. For an intended fixture specification, a particular mixture of phosphors is chosen so that the light output of the fixture exhibits color temperature in one of the following specific ranges along the black body curve: 2,725±145° Kelvin; 3,045±175° Kelvin; 3,465±245° Kelvin; and 3,985±275° Kelvin. In the example shown in FIG. 4A, the 'Sum' curve in the graph produced by the mixture of blue, green and orange emitting doped semiconductor nanophosphors would result in a white light output having a color temperature of 2800° Kelvin (within the 2,725±145° Kelvin range). That white output light also would have a CRI of 80 (higher than 75).

Returning to FIG. 1, assume that the phosphors at 27 in the fixture in system 10 include the blue, green and orange emitting doped semiconductor nanophosphors discussed above relative to FIGS. 3 and 4. As discussed earlier, the semiconductor LED chip formed by layers 13 and 15 is rated to emit near UV electromagnetic energy of a wavelength in the 380-420 nm range, such as 405 nm in the illustrated example, which is within the excitation spectrum of each of the three included phosphors in the mixture shown at 16. When excited, that combination of doped semiconductor nanophosphors re-emits the various wavelengths of visible light represented by the blue, green and orange lines in the graph of FIG. 4A. Combination or addition thereof in the fixture output produces "white" light, which for purposes of our discussion herein is light that is at least substantially white light. The white light emission from the solid state fixture in system 10 exhibits a CRI of 75 or higher (80 in the specific example of FIG. 4A). Also, the light output of the fixture exhibits color temperature of 2800° Kelvin, that is to say within the 2,725±145° Kelvin range. Other combinations of doped semiconductor nanophosphors can be used in a solid state lighting system 10 to produce the high CRI white light in the 3,045±175° Kelvin, 3,465±245° Kelvin, and 3,985±275° Kelvin ranges.

This system 10 provides a "remote" implementation of the semiconductor nanophosphors in that the semiconductor nanophosphors are outside of the package enclosing the actual semiconductor chip or chips and thus are apart or remote from the semiconductor chip(s). The remote semiconductor nanophosphors may be provided in or about the optic 12 in any of a number of different ways, such as in the form of an ink, paint or other coating on any appropriate portion of the inner reflective surface 29 of the macro reflector 27. Several different forms and locations of the semiconductor nanophosphors are shown and described with regard to later examples. In the first example of FIG. 1, the container 14 extends across a portion of the volume within the reflector 27 across the path of energy emissions from the source 11 through the optic 12.

At least some semiconductor nanophosphors degrade in the presence of oxygen, reducing the useful life of the semiconductor nanophosphors. Hence, it may be desirable to encapsulate the semiconductor nanophosphor material 16 in a manner that blocks out oxygen, to prolong useful life of the semiconductor nanophosphors. In the example of FIG. 1, the container 14 therefore may be a sealed glass container, the material of which is highly transmissive and exhibits a low absorption with respect to visible light and the relevant wavelength(s) of near UV energy. The interior of the container 14 is filled with the semiconductor nanophosphor material 16 in a manner that leaves little or no gas within the interior of the container. Any of a number of various sealing arrangements may be used to seal the interior once filled, so as to maintain a good oxygen barrier and thereby shield the semiconductor nanophosphors from oxygen.

The container 14 and the semiconductor nanophosphor material 16 may be located at any convenient distance in relation to the proximal end 31 of the reflector 27 and the solid state source 11. For example, the container 14 and the semiconductor nanophosphor material 16 could be located adjacent to the proximal end 31 of the reflector 27 (adjacent to that part of the reflective surface 29) and adjacent to the solid state source 11. Alternatively, as shown by the system 10' of FIG. 5, the container 14' and the semiconductor nanophosphor material 16' in the optic 12' could be located at or near the distal end of the reflector 27. The container may also have a wide variety of shapes. In the example of FIG. 1, the container 14 is relative flat and disk-shaped. In the example of FIG. 5, the container 14' has a convex outer curvature, although it could be convex or concave. The inner surface of the container 14' facing toward the solid state source 11 and the reflective surface 29 may be flat, concave or convex (as shown). Those skilled in the art will also recognize that the optic 12 or 12' could include a variety of other optical processing elements, such as a further reflector, one or more lenses, a diffuser, a collimator, etc.

The lighting system 10 (or 10') also includes a control circuit 33 coupled to the LED type semiconductor chip in the source 11, for establishing output intensity of electromagnetic energy output of the LED source 11. The control circuit 33 typically includes a power supply circuit coupled to a voltage/current source, shown as an AC power source 35. Of course, batteries or other types of power sources may be used, and the control circuit 33 will provide the conversion of the source power to the voltage/current appropriate to the particular one or more LEDs 11 utilized in the system 10. The control circuit 33 includes one or more LED driver circuits for controlling the power applied to one or more sources 11 and thus the intensity of energy output of the source and thus of the fixture. The control circuit 21 may be responsive to a number of different control input signals, for example to one or more user inputs as shown by the arrow in FIG. 1, to turn power ON/OFF and/or to set a desired intensity level for the white light output provided by the system 10.

In the exemplary arrangement of the optic 12 (or 12'), when near UV light energy from the 405 nm sold state source 11 enters the interior volume of the reflector 27 and passes through the outer glass of the container 14 into the material 16 bearing the semiconductor nanophosphors. Much of the near UV emissions enter the container directly, although some reflect off of the surface 29 and into the container. Within the container 14 or 14', the 405 nm near UV energy excites the semiconductor nanophosphors in material 16 to produce light that is at least substantially white, that exhibits a CRI of 75 or higher and that exhibits color temperature in one of the specified ranges. Light resulting from the semiconductor nanophosphor excitation, essentially absorbed as near UV energy and reemitted as visible light of the wavelengths forming the desired white light, passes out through the material 16 and the container 14 or 14' in all directions. Some light emerges directly out of the optic 12 as represented by the undulating arrows. However, some of the white light will also reflect off of various parts of the surface 29. Some light may even pass through the container and semiconductor nanophosphor material again before emission from the optic.

In the orientation illustrated in FIGS. 1 and 5, white light from the semiconductor nanophosphor excitation, including any white light emissions reflected by the surface 29 are directed upwards, for example, for lighting a ceiling so as to indirectly illuminate a room or other habitable space below the fixture. The orientation shown, however, is purely illustrative. The optic 12 or 12' may be oriented in any other direction appropriate for the desired lighting application, including downward, any sideways direction, various intermediate angles, etc. Also, the examples of FIGS. 1 and 5 utilize relatively flat reflective surfaces for ease of illustration. Those skilled in the art will recognize, however, that the principles of that example are applicable to optics of other shapes and configurations, including optics that use various curved reflective surfaces (e.g. hemispherical, semi-cylindrical, parabolic, etc.).

FIG. 6A illustrates another lighting system 50 that may utilize near UV solid state sources and a remote semiconductor nanophosphor material, typically containing doped semiconductor nanophosphors, for emitting visible light for white light type general lighting applications. The illustrated system 50 includes a diffusely reflective volume forming an optical cavity 51. The cavity forms a first primary optic of the system 50, and the system 50 may include a secondary optic processing the output light from the cavity as discussed more later. As in the earlier example, the doped semiconductor nanophosphors are remotely implemented, that is to say in the macro optic (as opposed to being within the solid state source(s)).

One or more reflectors having a diffusely reflective interior surface form the cavity 51, to receive and combine light of various colors/wavelengths within the desired spectral range. The cavity 51 may have various shapes. The illustrated cross-section would be substantially the same if the cavity is hemispherical or if the cavity is semi-cylindrical with the cross-section taken perpendicular to the longitudinal axis. As discussed in detail with regard to the example of FIGS. 6A and 6B, but applicable to several later examples as well, hemispherical shapes for the volume of the integrating cavity and thus the reflective surface(s) thereof are shown and discussed, most often for convenience. Examples having shapes corresponding to a portion or segment of a sphere or cylinder are preferred for ease of illustration and/or because curved surfaces provide better efficiencies than other shapes that include more edges and corners which tend to trap light. Those skilled in the art will understand, however, that the volume of the cavity of the fixture, may have any shape providing adequate reflections within the volume/cavity for a particular lighting application.

At least a substantial portion of the interior surface(s) of the cavity 51 exhibit(s) diffuse reflectivity. It is desirable that the cavity surface or surfaces have a highly efficient reflective characteristic, e.g. a reflectivity equal to or greater than 90%, with respect to the relevant wavelengths. In the example of FIGS. 6A and 6B, the surface is highly diffusely reflective, approximately 97-99% reflective, with respect to energy in at least the visible and near-ultraviolet portions of the electromagnetic spectrum.

For purposes of this discussion, the cavity 51 in the apparatus 50 is assumed to be hemispherical. In the example, a hemispherical dome 53 and a substantially flat cover plate 55 form the optical cavity 51. Although shown as separate elements, the dome and plate may be formed as an integral unit. At least the interior facing surface 54 of the dome 53 and the interior facing surface 56 of the cover plate 55 are highly diffusely reflective, so that the resulting cavity 51 is highly diffusely reflective with respect to the electromagnetic energy spectrum produced by the system 50, particularly that in the spectral range for the intended white light output. As a result the cavity 51 is an integrating type optical cavity. One or both of the inner surfaces 54, 56 may have an associated coating or container of semiconductor nanophosphor material, so that the impact of some of the energy on the surfaces causes emission of visible light of the desired white characteristics. As discussed more later, the example implements the semiconductor nanophosphor material, containing doped semiconductor nanophosphors, at 58 on the inner surface 56 of the plate 55.

Elements of the reflector forming the cavity 51 (e.g. consisting of dome 53 and plate 55 in the example) may be formed of a diffusely reflective plastic material, having a 97% or higher reflectivity and a diffuse reflective characteristic. Examples of such materials include Valar™ and WhiteOptics™. Another example of a material with a suitable reflectivity at or approaching 99% is Spectralon™. Alternatively, one or more of the elements forming the optical integrating cavity 51 may comprise a rigid substrate having an interior surface, and a diffusely reflective coating layer formed on the interior surface of the substrate so as to provide the diffusely reflective interior surface 54 or 56 of the optical integrating cavity 51. The coating, for example, might be Duraflect™. Alternatively, the coating layer might take the form of a flat-white paint or white powder coat.

The optical integrating cavity 51 has an optical aperture or light passage 57 for allowing emission of light. The optical aperture 51 in this example approximates a circle, although other shapes are possible. In the example, the aperture 57 is a physical passage or opening through the approximate center of the cover plate 55. Those skilled in the art will recognize, however, that the intent is to allow efficient passage of light out of the cavity 51, and therefore the optical aperture may be through some other device or material that is transmissive to the relevant wavelengths. For example, the aperture may be formed of a diffuser and/or a filter. If implemented as a filter, the filter at the aperture might allow passage of visible light but block UV emissions from the cavity. Also, the optical aperture 51 may be at any other convenient location on the plate 55 or the dome 53; and there may be a plurality of openings or other light passages, for example, oriented to allow emission of integrated visible white light in two or more different directions or regions.

Because of the diffuse reflectivity within the cavity 51, light within the cavity is integrated before passage out of the aperture 57. In the example, the fixture portion of the system 50 is shown emitting the light downward through the aperture 57, for convenience. However, the fixture may be oriented in any desired direction to perform a desired application function, for example to provide visible luminance to persons in a particular direction or location with respect to the fixture or to illuminate a different surface such as a wall, floor or table top.

The system 50 also includes a plurality of sources of near UV radiant energy, similar to the solid state sources 11 in the earlier examples. Although any solid state source producing energy in the range of 380-420 nm may be used, for purposes of further discussion of this example, we will assume that the sources are near UV LEDs 59 rated to produce near UV light energy at or about 405 nm. Three of the 405 nm LEDs 59 are visible in the illustrated cross-section of FIG. 6A. The LEDs are generally similar to the LED type source 11 of FIG. 2. Any number of such LEDs 59 may be used. The LEDs 59 supply 405 nm light into the interior of the optical integrating cavity 51. As shown, the points of emission into the interior of the optical integrating cavity are not directly visible from outside the fixture through the aperture 57.

In this example, 405 nm near UV light outputs of the LED sources 59 are coupled directly to openings at points on the interior of the cavity 51, to emit near UV light directly into the interior of the optical integrating cavity 51. The LEDs 59 may be located to emit light at points on the interior wall of the reflective element 53, e.g. at or near the junction with the plate 55, although preferably such points would still be in regions out of the direct line of sight through the aperture 57. For ease of construction/illustration, however, the exemplary openings for the LEDs 59 are formed through the cover plate 55. On the plate 55, the openings/LEDs may be at any convenient locations. Of course, the LEDs or other solid state sources may be coupled to the points for entry of energy into the cavity 51 in any other manner that is convenient and/or facilitates a particular system application. For example, one or more of the sources 59 may be within the volume of the cavity 51. As another example, the sources 59 may be coupled to the openings into the cavity 51 via a light guide or pipe or by an optical fiber.

In the light fixture in the system 50 of FIG. 6A, the cavity 51 incorporates a semiconductor nanophosphor material shown at 58, which contains for example orange, green and blue emitting doped semiconductor nanophosphors like those discussed above relative to FIGS. 3 and 4. The semiconductor nanophosphors could be implemented in a container and/or using any of the bearer materials discussed above relative to the example of FIG. 1. In the example of FIG. 6A, the semiconductor nanophosphor is provided as an ink, paint or other form of coating 58 formed by a suitable binder and doped semiconductor nanophosphor particles. The semiconductor nanophosphor coating 58 could be on any reflective surface of the cavity 51. However, as illustrated, the semiconductor nanophosphor coating 58 is formed on the reflective inner surface 56 of the plate 55. The coating is shown covering substantially all of the reflective inner surface 56, although the coating could be deployed on a more limited portion of the surface 56. Of note, the coating 58 is located on the surface(s) where it is not directly visible from outside the fixture through the aperture 57, for example, so that the color of the coating when the lighting system 50 is off is not visible to an observer. Much of the surface 54 of the reflector 53 would be visible through the fixture aperture 57 and would appear white to the observer, in this example.

The example shows the semiconductor nanophosphor material 58 on regions of surface 56 between the near UV LEDs 59. Those skilled in the art will appreciate, however, that the material 58 may extend over the light emitting surfaces of the LEDs 59 or over the apertures through which the near UV energy from the LEDs enters the cavity 51, so that the near UV energy initially passes through the material 58 as it enters the cavity 51.

Again, each of the doped semiconductor nanophosphors used in coating 58 is of a type or configuration excitable by the 405 nm near UV energy from the LED sources 59. Each such phosphor used in the system 50 emits light in a different spectrum, such as respective ones of the orange, green and blue spectra discussed above with regard to FIGS. 3 and 4. Such spectra do not overlap with the absorption spectra of the phosphors. When all of the various types of doped semiconductor nanophosphors used in the coating 58 are excited by the 405 nm near UV energy, the phosphors together produce light that is at least substantially white and has a color rendering index (CRI) of 75 or higher. The light output of the system 50 produced by this near UV excitation of the phosphor in the coating 58 may exhibit color temperature of 2,725±145° Kelvin (as in FIG. 4A). Alternatively the white light output may exhibit color temperature of 3,045±175° Kelvin, the white output light may exhibit color temperature of 3,465±245° Kelvin, or that light may exhibit color temperature of 3,985±275° Kelvin.

In the example of FIG. 6A, the solid state sources emit their 405 nm near UV energy toward the reflective inner surface 54 of the dome shaped reflector 53. These emissions are diffusely reflected by the surface 54 back toward the plate 55. Much of the reflected 405 inn energy in turn impacts on the semiconductor nanophosphors in the coating 58. The coating tends to be somewhat transmissive and some 405 nm energy impacting the coating may pass through and diffusely reflect from the surface 56 of the plate shaped reflector 55 and back through the coating. At some point on one or more passes through the coating 58, photons of the 405 nm energy impact and excite particles of the semiconductor nanophosphors contained in the coating. When so excited, the phosphor particles re-emit electromagnetic energy but now of the wavelengths for the desired visible spectrum for the intended white light output. The visible light produced by the excitation of the semiconductor nanophosphor particles diffusely reflects one or more times off of the reflective inner surfaces 54, 56 forming the cavity 51. This diffuse reflection within the cavity integrates the light produced by the semiconductor nanophosphor excitation to form integrated light of the desired characteristics at the optical aperture 57 providing a substantially uniform output distribution of integrated light (e.g. substantially Lambertian).

The effective optical aperture at 57 forms a virtual source of white light from the first optic (and possible from the fixture portion) of the system 50. The integration tends to form a relatively Lambertian distribution across the virtual source. When the fixture illumination is viewed from the area illuminated by the combined light, the virtual source at 57 appears to have substantially infinite depth of the integrated light. Also, the visible intensity is spread uniformly across the virtual source, as opposed to forming one or more individual small point sources of higher intensity as would be seen if the one or more solid state sources were directly observable without sufficient diffuse processing before emission through the optical aperture.

Pixelation and color striation are problems with many prior solid state lighting devices. When a non-cavity type LED fixture output is observed, the light output from individual LEDs or the like appear as identifiable/individual point sources or 'pixels.' Even with diffusers or other forms of common mixing, the pixels of the sources are apparent. The observable output of such a prior system exhibits a high maximum-to-minimum intensity ratio. In systems using multiple light color sources, e.g. RGB LEDs, unless observed from a substantial distance from the fixture, the light from the fixture often exhibits striations or separation bands of different colors. Although this is not as pronounced with systems using only one color of LED, there may still be separation band issues. In systems using an integrating cavity, such as the cavity 51 in the example of FIG. 6A, however, the optical integrating volume or cavity 51 converts the point source output(s) and light resulting from excitation of the semiconductor nanophosphor to a virtual source output of light, at the effective optical aperture formed at region 57, which is free of pixilation or striations. The virtual source output is unpixelated and relatively uniform across the apparent output area of the fixture, e.g. across the optical aperture 57. The optical integration sufficiently mixes the light so that the light output exhibits a relatively low maximum-to-minimum intensity ratio across that optical aperture 57. In virtual source examples discussed herein, the virtual source light output exhibits a maximum-to-minimum ratio of 2 to 1 or less over substantially the entire optical output area. The area of the virtual source is at least one order of magnitude larger than the area of the point source output(s) of the solid state light emitter(s) 59.

Semiconductor nanophosphors, such as the doped semiconductor nanophosphors used in the examples, produce relatively uniform repeatable performance somewhat independent of the rated wavelength of the source, so long as within the excitation spectrum. Thus, having chosen appropriate phosphors to produce light of the desired CRI and color temperature, fixtures using that phosphor formulation will consistently produce white light having the CRI in the same range and color temperature in the same range with little or not humanly perceptible variation from one fixture to another. In this way, the use of the semiconductor nanophosphors to produce the actual white light masks any variation in the wavelengths of electromagnetic energy produced by different solid state sources (even though the solid state sources may be rated to produce the same color of light).

The system 50 also includes a control circuit 61 coupled to the 405 nm LEDs 59 for establishing output intensity of electromagnetic energy generated by each of the LED type solid state sources. The control circuit 61 typically includes a power supply circuit coupled to a source, shown as an AC power source 63, although those skilled in the art will recognize that batteries or other power sources may be used. In its simplest form, the circuit 61 includes a common driver circuit to convert power from source 63 to the voltages/current appropriate to drive the LEDs 59 at an output intensity specified by a control input to the circuit 61. The control input may indicate a desired ON/OFF state and/or provide a variable intensity control setting. The control circuit 61 may be responsive to a number of different control input signals, for example, to one or more user inputs as shown by the arrow in FIG. 6A. Although not shown in this simple example, feedback may also be provided.

The optical aperture 57 may serve as the light output of the fixture, directing optically integrated white light of the desired characteristics and relatively uniform intensity distribution to a desired area or region to be illuminated in accord with a particular general lighting application of the fixture. Although not shown in this example, the opening through plate 55 that forms the optical aperture 57 may comprise a somewhat transmissive or transparent region of the plate 55 or may comprise a physical opening having a grate, lens, filter or diffuser (e.g. a holographic element) to help distribute the output light and/or to close the opening against entry of moisture or debris. If a filter is provided, for example, the filter at the aperture 57 might allow passage of visible light but block UV emissions from the cavity 51.

For some applications, the system 50 includes an additional deflector or other optical processing element as a secondary optic, e.g. to distribute and/or limit the light output to a desired field of illumination. In the example of FIG. 6A, the fixture part of the system 50 also utilizes a conical deflector 65 having a reflective inner surface 69, to efficiently direct most of the light emerging from the virtual light source at optical aperture 57 into a somewhat narrow field of illumination. The deflector is essentially a secondary optic in that it further processes light output from the first or primary optic, i.e. from cavity 51. A small opening at a proximal end of the deflector is coupled to the optical aperture 57 of the optical integrating cavity 51. The deflector 65 has a larger opening 67 at a distal end thereof. The angle and distal opening size of the conical deflector 65 define an angular field of electromagnetic energy emission from the apparatus 50. Although not shown, the large opening of the deflector may be covered with a transparent plate, a diffuser or a lens, or covered with a grating, to prevent entry of dirt or debris through the cone into the system and/or to further process the output white light. Alternatively, the deflector could be filled with a solid light transmissive material of desirable properties.

The conical deflector 65 may have a variety of different shapes, depending on the particular lighting application. In the example, where the cavity 51 is hemispherical and the optical aperture 57 is circular, the cross-section of the conical deflector is typically circular. However, the deflector may be somewhat oval in shape. Even if the aperture 57 and the proximal opening are circular, the deflector may be contoured to have a rectangular or square distal opening. In applications using a semi-cylindrical cavity, the deflector may be elongated or even rectangular in cross-section. The shape of the optical aperture 57 also may vary, but will typically match the shape of the small end opening of the deflector 65. Hence, in the example the optical aperture 57 would be circular. However, for a device with a semi-cylindrical cavity and a deflector with a rectangular cross-section, the optical aperture may be rectangular.

The deflector 65 comprises a reflective interior surface 69 between the distal end and the proximal end. In some examples, at least a substantial portion of the reflective interior surface 69 of the conical deflector exhibits specular reflectivity with respect to the integrated electromagnetic energy. For some applications, it may be desirable to construct the deflector 65 so that at least some portions of the inner surface 69 exhibit diffuse reflectivity or exhibit a different degree of specular reflectivity (e.g. quasi-specular), so as to tailor the performance of the deflector 65 to the particular application. For other applications, it may also be desirable for the entire interior surface 69 of the deflector 65 to have a diffuse reflective characteristic. In such cases, the deflector 65 may be constructed using materials similar to those taught above for construction of the reflector (53, 55) of the optical integrating cavity 51.

In the exemplary system 50 of FIG. 6A, the semiconductor nanophosphor material is deployed within the cavity 51 that serves as the primary optic. It is also envisioned that material containing doped semiconductor nanophosphors may be deployed in the secondary optic formed by deflector 65, either instead of or in addition to the doped semiconductor nanophosphors deployed in the cavity 51. For example, a container of the phosphor bearing material similar to those shown at 14', 16' in FIG. 5 could be deployed at the larger opening 67 at a distal end of the deflector 65.

In the illustrated example, the large distal opening 67 of the deflector 65 is roughly the same diameter as the structure forming the cavity 51. In some applications, this size relationship may be convenient for construction purposes. However, a direct relationship in size of the distal end of the deflector and the cavity is not required. The large end of the deflector may be larger or smaller than the cavity structure. As a practical matter, the size of the cavity 51 is optimized to provide the integration or combination of light within the cavity 51. The size, angle and shape of the deflector 65 in turn determine the area or region that will be illuminated by the combined or integrated light emitted from the cavity 51 via the optical aperture 57.

Figure 7:
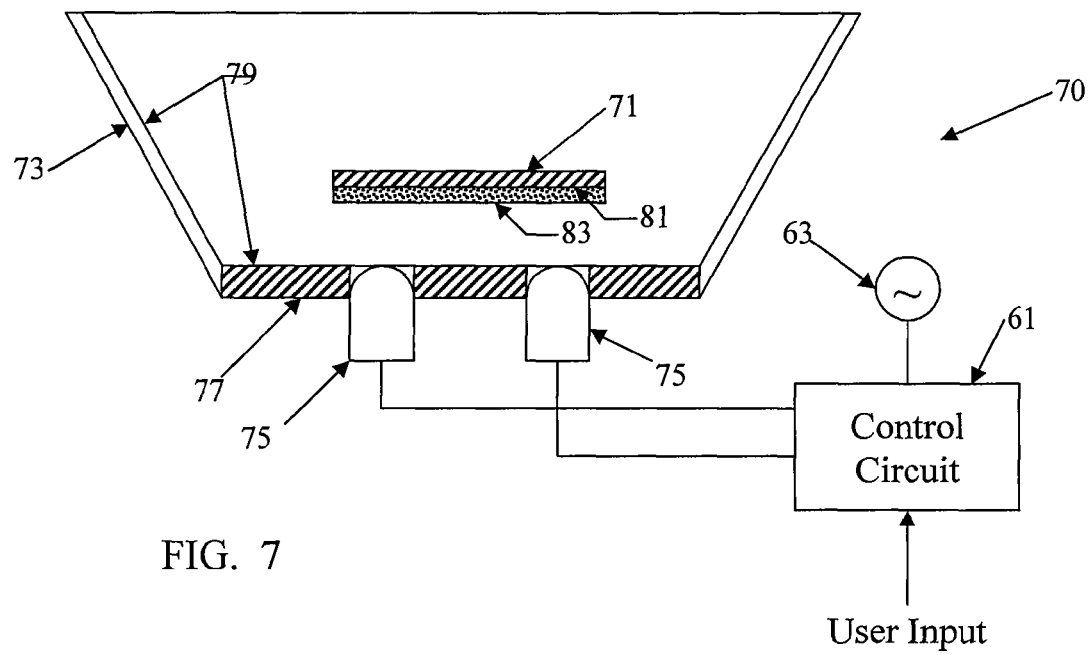
FIG. 7 illustrates an example of another white light emitting system where the semiconductor nanophosphors are located on a reflective surface of a reflective mask in the optic, with certain elements of the fixture shown in cross-section.
Figure 8:
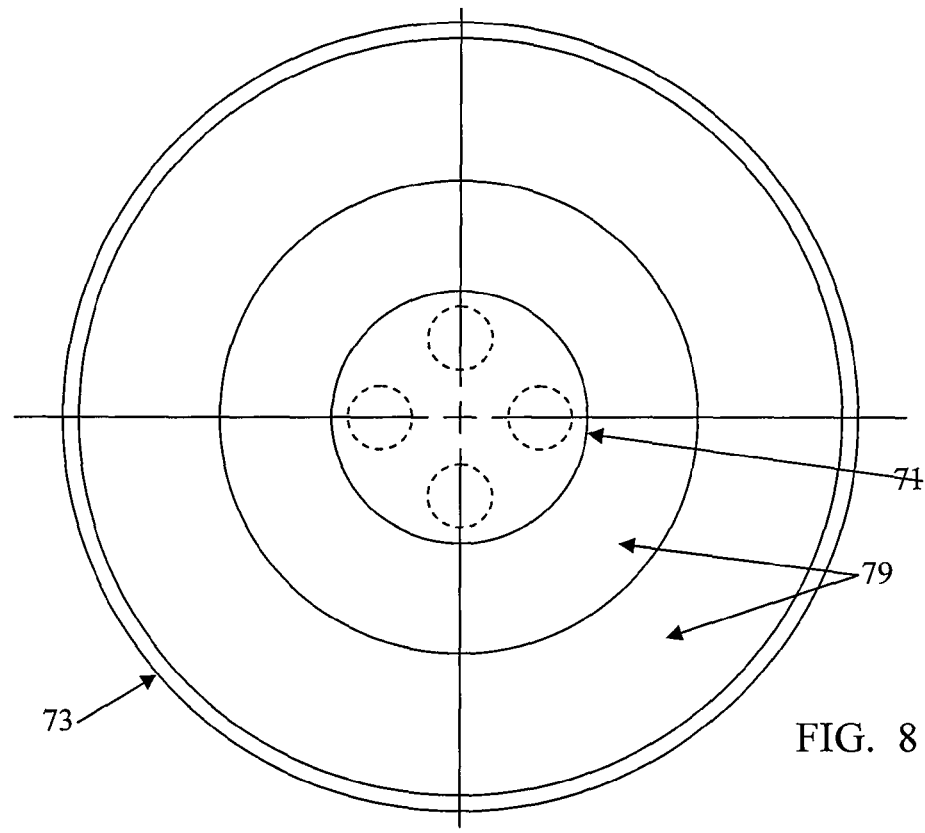
FIG. 8 is a top view of the fixture used in the system of FIG. 7.

FIGS. 7 and 8 are cross-section and top views of an example of a system 70 that utilizes a reflective mask 71 within the volume of a principal reflector 73, where the doped semiconductor nanophosphors are deployed remotely from the near UV solid state sources 75 on the surface 81 of the reflective mask 71 facing toward the solid state sources 75. As with the earlier examples, the directional orientation is given only by way of an example that is convenient for illustration and discussion purposes.

The system 70 may include one or more solid state sources 75 of 405 nm near UV energy, as in the example of FIG. 2 above. The system 70 utilizes the reflector 73, located outside the energy sources 75. The reflector 73 has a reflective inner surface 79, which may be diffusely reflective, specular or quasi-specular, as in the example of FIG. 1. In the example of FIG. 7, the emitting region of each near UV solid state source 75 fits into or extends through an aperture in a back section 77 of the reflector 73. The sources 75 may be coupled to the reflector 73 in any manner that is convenient and/or facilitates a particular lighting application of the system 70, as discussed above relative to the example of FIG. 1.

The lighting system 70 uses a second reflector forming a mask 71, positioned between the solid state sources 75 and a region to be illuminated by the visible white light output from the system. The reflector 71 masks direct view of the near UV solid state sources 75 by any person in that region. Although the mask reflector 71 could be near the distal end of the reflector 73 or even outside the reflector 73 adjacent to the distal end, in the illustrated example, the mask 71 is within the space or volume formed by the first reflector 73 and somewhat nearer the back section 77 of the reflector 73. The base material used to form the mask reflector 71 may be any convenient one of the materials discussed above for forming reflectors. The surface 81 facing toward the near UV solid state sources 75 is reflective. Although it may have other reflective characteristics, in the example, the surface 81 is diffusely reflective. At least a substantial portion of the area of the surface 81 facing toward the solid state sources 75 is covered by a semiconductor nanophosphor material 83. As in the example of FIG. 6A, the semiconductor nanophosphor material may be in a suitable container but here is shown as a surface coating analogous to the coating the example of FIG. 6A.

Again, the doped semiconductor nanophosphors in the material shown at 83 are of types or configurations excitable by the 405 nm near UV energy from the solid state sources 75. Each type of doped semiconductor nanophosphors produces a different visible spectrum, which does not overlap with any of the absorption spectra. The light emissions together provide a device output light that is at least substantially white and has a color rendering index (CRI) of 75 or higher. The output light produced during this near UV excitation of the semiconductor nanophosphors in the coating 83 may exhibit color temperature of 2,725±145° Kelvin as in FIG. 3. Alternatively, the output light may exhibit color temperature of 3,045±175° Kelvin, the output light produced may exhibit color temperature of 3,465±245° Kelvin, or the output light may exhibit color temperature of 3,985±275° Kelvin.

The system 70 includes a control circuit 61 and power source 63, similar to those in several of the earlier examples. These elements control the operation and output intensity of each LED 75. The intensities determine the amount of 405 nm light energy introduced into the space between the reflectors 71 and 77. The intensities of that near UV light that pumps the semiconductor nanophosphors in the coating 83 also determine the amount visible light generated by the excitation of the semiconductor nanophosphors. Visible light generated by the phosphor excitation reflects one of more times from the surfaces of the reflectors 71 and 77 and is emitted from the distal end of the reflector The 405 nm sources actually produce visible light, which may appear purple to an observer. The mask 71 serves to control glare from the sources 75 and/or to provide visual comfort to a person observing the fixture. From many angles, such an observer will not directly view the bright light sources 75, although in this example, some near UV light may escape the system without phosphor conversion. To maintain fixture efficiency, the mask 71 may be sized and positioned so as to impact efficiency as little as possible and not significantly affect the illumination field of view (FOV) or light distribution. As in the example of FIG. 6A, the coating 83 is located on a surface 81 where it is not directly visible from outside the fixture through the reflector 73, for example, so that the color of the coating when the light is off is not visible to an observer. The opposite surface of the mask reflector 71 would be visible through the distal aperture of the reflector 73 and would appear white (or specular, etc.) to the observer. The semiconductor nanophosphor excitation, however, does produce white light of the desired CRI and color temperature characteristics, as in the earlier embodiments.

The example of FIGS. 7 and 8 is a circular example and utilizes relatively flat reflective surfaces. Those skilled in the art will recognize that the principles of that example are applicable to systems of other shapes and configurations (e.g. rectangular) and to systems using various curved reflective surfaces (e.g. hemispherical, semi-cylindrical, parabolic, etc.).

Figure 9:
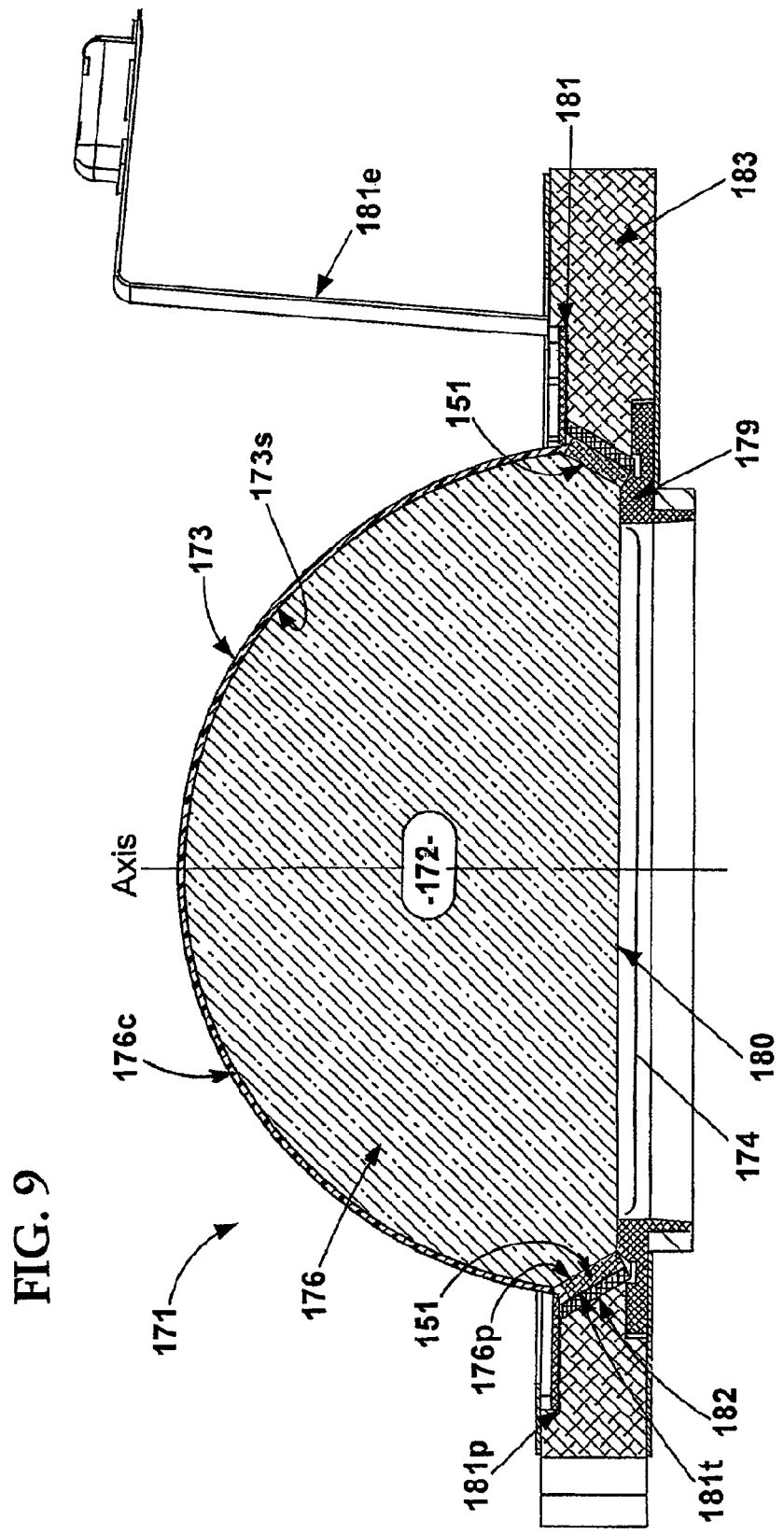
FIG. 9 is a cross-sectional view of the solid state light fixture of another white system, where the fixture has a solid-filled optical integrating cavity.

FIG. 9 is a cross-section view of a light engine portion of a fixture that is particularly efficient at extracting light from solid state light sources, optically integrating white light from phosphor emissions and delivering a uniform white light output, which is intended for general lighting, for example, in a region or area intended to be occupied by a person. For convenience, the lighting apparatus is shown in an orientation for emitting light downward. However, the apparatus 171 may be oriented in any desired direction to perform a desired general lighting application function. As in the earlier examples, the light engine 171 uses near ultraviolet (UV) electromagnetic energy from a number of sources to pump semiconductor nanophosphors, to produce high CRI white light. Like the example of FIGS. 6A and 6B, the light engine 171 incorporates an optical integrating cavity to efficiently combine the emissions and produce a highly uniform white light output, however, in this example, the cavity is filled with a light transmissive structure.

The apparatus 171 could be used alone to form a light fixture or more likely would be used with other housing elements and possibly with a secondary optic (not shown) to form the overall commercial light fixture product. Together with the other electrical components, the apparatus or "light engine" 171 of FIG. 9 (or the fixture including the associated housing and deflector elements) would form a lighting system.

The optic in the exemplary fixture or engine 171 includes a plurality of LED type near UV solid state light emitters 151 as well as a reflector 173 and a light transmissive structure 176 forming an optical integrating cavity or volume 172. The emitters 151 emit near UV electromagnetic energy in a range of 380-420 nm. The emitters 151 may be 405 nm emitters similar to the emitters 11 and 59 in the earlier examples. The emitters 151 are sufficient in number and strength of output for the light engine 171 to produce light intensity sufficient for the general lighting application of the fixture.

As shown, the light transmissive structure 176 has a contoured outer surface 176c and an optical aperture surface 180. The contoured outer surface 176c could extend essentially as a hemisphere to an edge at which it would be substantially perpendicular to the optical aperture surface 180 (compare say to FIG. 10). However, in this example, the surface 176c corresponds to a segment of a sphere somewhat less than a hemisphere and does not extend continuously to the periphery of the aperture surface 180. Instead, the region between the curve of the upper contoured surface 176c and the optical aperture surface 180 is beveled or angled. In this example, the light transmissive structure 176 therefore has a peripheral optical coupling surface 176p between the contoured outer surface 176c and the optical aperture surface 180. In this example, the peripheral optical coupling surface 176p forms an obtuse angle with respect to the optical aperture surface 180 (and an acute angle with respect to the vertical in the downlight orientation of FIG. 9). At least the outer peripheral portion 176p of the structure 176 along the lower portion of contoured surface 176c is substantially rigid.

In this example, the contoured surface 176c has a roughened or etched texture, and some or all of the aperture surface 180 may have a roughened or etched texture. In such an implementation, at least any portion of the angled peripheral optical coupling surface 176p of the light transmissive structure 176 that receives light from one or more of the solid state light emitters 151 likely would be highly transparent. Of course, the aperture surface 180 may be highly transparent as well. In the example, the aperture surface 180 is shown as a flat surface. However, those skilled in the art will recognize that this surface 180 may have a convex or concave contour.

In the example of FIG. 9, the outer surfaces of the structure 176 approach or approximate a hemisphere that is somewhat truncated at the peripheral region by the angled surface 176p. The optical aperture surface identified by number 180 approximates a circle. Examples having shapes corresponding to a portion or segment of a sphere or cylinder are preferred for ease of illustration and/or because curved surfaces provide better efficiencies than other shapes that include more edges and corners which tend to trap light. Those skilled in the art will understand, however, that the volume of the light transmissive structure, and thus the optical cavity 172 of the fixture or light engine 171, may have any shape providing adequate reflections within the volume/cavity for a particular application. For example, the contour of the upper surface 176c may be hemispherical, may correspond in cross section to a segment of a circle less than a half circle (less than hemispherical), or may extend somewhat further than a hemisphere to correspond in cross section to a segment of a circle larger than a half circle. Also, the contoured portion 176c may be somewhat flattened or somewhat elongated relative to the illustrated axis of the optical aperture 174, the aperture surface 180 and the exemplary solid 176 (in the vertical direction in the exemplary downlight orientation depicted in FIG. 9). The coupling surface 176p is shown having a substantially flat cross-section, although of course it would curve around the circular structure 176. However, other shapes or contours for the surface 176p may be used, for example, with a convex cross section or concave cross-section or with indentations to receive emitting surfaces or elements of particular types of LEDs 151.

Here, the light transmissive structure 176 forming the volume 172 comprises a one piece light transmissive solid 176 substantially filling the volume 172, although other implementations are discussed later. Like the fixtures in the earlier examples, the fixture or light engine 171 includes phosphors, such as doped semiconductor nanophosphors, for converting the near UV energy from the near UV solid state light emitters 151 into visible white light, with a color rendering index (CRI) of 75 or higher. By using one of the mixtures of doped semiconductor nanophosphors, like those in the earlier examples, the white output light may exhibit a color temperature in one of the several specific ranges along the black body curve.

The phosphors may be embodied in the light engine 171 in any of a variety of ways deemed advantageous or convenient, and several alternatives are described later with respect to FIGS. 10-13B. In the example of FIG. 9, it is assumed that the doped semiconductor nanophosphors are doped or otherwise embedded in the material forming the light transmissive solid 176. For example, if formed of a cured silicon gel, the doped semiconductor nanophosphors dispersed throughout the hardened gel, by mixing within the gel before curing. The phosphors may be fairly widely dispersed throughout the solid 176 to minimize visible discoloration caused by the phosphors when the device is off.

Hence, in this example, the solid 176 is a single integral piece of light transmissive material, that also incorporates the doped semiconductor nanophosphors. For optical efficiency, it is desirable for the solid structure 176 to have a high transmissivity with respect to light of the relevant wavelengths processed within the optical cavity 172 and/or a low level of light absorption with respect to light of such wavelengths.

The fixture or light engine 171 also includes the reflector 173, which has a diffusely reflective interior surface 173s extending over at least a substantial portion of the outer surface of the light transmissive structure 176, in this case over the contoured outer surface 176c although it could extend over some portion or portions of the angled coupling surface 176p not expected to receive light input from the emitters 151.

The surface 176c is roughened for example by etching. For optical efficiency, however, the surface texture should provide only a minimal air gap between the diffusely reflective interior surface 173s of the reflector 173 and the corresponding portion(s) of the contoured outer surface 176c of the light transmissive structure 176. The diffuse reflective surface 173s forms an optical integrating cavity from and/or encompassing the volume 172 of the light transmissive structure 176, with an optical aperture 174 formed from a portion or all of the aperture surface 180 of the light transmissive structure 176.

It is desirable that the diffusely reflective surface(s) 173s of the reflector 173 have a highly efficient reflective characteristic, e.g. a reflectivity equal to or greater than 90%, with respect to the relevant wavelengths. Diffuse white materials exhibiting 98% or greater reflectivity are available. Although other materials may be used, including some discussed above relative to earlier examples, the illustrated example of FIG. 9 uses WhiteOptics™. The WhiteOptics™ reflector 173 is approximately 97% reflective with respect to the visible white light from the LED type solid state emitters 151. Of course, Valar™, Spectralon™, and Duraflect™ and other materials, as discussed earlier relative to FIG. 6A could be used to form the reflector 173. In the example, the entire inner surface 173s of the reflector 173 is diffusely reflective, although those skilled in the art will appreciated that one or more substantial portions may be diffusely reflective while other portion(s) of the surface 173s may have different light reflective characteristics, such as a specular or semi-specular characteristic.

At least a portion of the aperture surface 180 of the light transmissive structure 176 serves as a transmissive optical passage or effective "optical aperture" 174 for emission of integrated light, from the optical integrating volume 172, in a direction to facilitate the particular general lighting application in the region or area to be illuminated by the light fixture (generally downward and/or outward from the fixture in the orientation of FIG. 9). The entire surface 180 of the solid structure 176 could provide light emission. However, the example of FIG. 9 includes a mask 179 having a reflective surface facing into the optical integrating volume 172, which somewhat reduces the surface area forming the transmissive passage to that portion of the surface shown at 174. The optical volume 172 operates as an optical integrating cavity (albeit one filled with the light transmissive solid of structure 176 impregnated with the remote doped semiconductor nano-phosphors); and the portion 174 for light emission forms the optical aperture of that cavity, to provide a virtual source of highly uniform white light at that aperture similar to that of the aperture in the example of FIG. 6A.

As noted, the surface of the mask 179 that faces into the optical integrating volume 172 (faces upward in the illustrated orientation) is reflective. That surface may be diffusely reflective, much like the surface 173s, or that mask surface may be specular, quasi specular or semi-specular. Other surfaces of the mask 179 may or may not be reflective, and if reflective, may exhibit the same or different types/qualities of reflectivity than the surface of the mask 179 that faces into the optical integrating volume 172. In one configuration, the surface of the mask 179 that faces into the optical integrating volume 172 might be diffusely reflective (having reflective properties similar to those of reflective surface 173s), whereas the surface of the mask facing inward/across the aperture 174 might be specular. Specular reflectivity across the aperture reduces reflection back through the aperture into the integrating volume due to diffuse reflection that might otherwise occur if that portion of the mask exhibited a diffuse reflectivity.

In the example, the light fixture 171 also includes one or more of the near UV light solid state light emitters 151. Although the near UV light could be anywhere within the 380-420 nm range, for discussion purpose, the exemplary fixture 171 uses sources 151 rated to emit 405 nm electromagnetic energy in the near UV range. The light emitters 151 are held against the angled peripheral optical coupling surface 176p, to supply near UV light through that surface into the interior volume 172 formed by the light transmissible structure 176 to excite the embedded phosphors. There may be some minimal air gap between the emitter output and the optical coupling surface 176p. However, to improve out-coupling of the near UV light from the emitters 151 into the light transmissive solid structure 176, it may be helpful to provide an optical grease, glue or gel between the peripheral optical coupling surface 176p and the output of each solid state light emitter 151. This material eliminates any air gap and provides refractive index matching relative to the material of the relevant portion of the light transmissive structure 176, for example, to the material forming the angled peripheral optical coupling surface 176p.

The exemplary light fixture or engine 171 also includes a flexible circuit board 181. The flexible circuit board 181 has a mounting section or region 181p that typically will be at least substantially planar (and is therefore referred to herein as a "planar" mounting section) for convenience in this example. The planar mounting section 181p of the flexible circuit board 181 has an inner peripheral portion. In this example, the lateral shape of the solid forming the light transmissive structure 176 is circular. The inner peripheral portion of the flexible circuit board 181 has a shape substantially similar shape, that is to say a circular shape in the example. The circular inner peripheral portion of the flexible circuit board 181 has a size slightly larger than the circular outer peripheral portion at the edge between the surfaces 176c and 176p of the light transmissive structure 176. The flexible circuit board includes a strip 181e, extending away from the planar mounting section, for providing electrical connection(s) to the driver circuitry.

The flexible circuit board 181 also has flexible tabs 181t attached to and extending from the inner peripheral region of the flexible circuit board 181. As noted earlier, the number and type of LED type solid state light emitters 151 used in the fixture 171 are selected so as to produce light intensity sufficient for a general lighting application of the fixture 171. The near UV light emitters 151 are mounted on the tabs 181t. At least one of the solid state light emitters 151 is mounted on a first surface of each of the tabs 181t of the flexible circuit board 181, in this example, although some tabs could be empty or carry other elements such as a light sensor instead of a LED.

The fixture 171 also includes a heat sink member 183. The heat sink member 183 is constructed of a material with good heat conduction properties and sufficient strength to support the flexible circuit board and associated LED light emitters, typically a metal such as aluminum. Although not shown for simplicity, cooling fins may be coupled to the heat sink member 183, for example, as part of one or more additional aluminum housing components.

The heat sink member 183 has an inner peripheral portion of substantially similar shape and of a size slightly larger than the outer peripheral portion of the light transmissive structure 176. In this case, the heat sink member 183 has a circular inner peripheral portion but with a surface at a slant corresponding to the angle of surface 176p. The obtuse angle of the peripheral optical coupling surface 176p with respect to the optical aperture surface 180 of light transmissive structure is approximately 120° (interior angle with respect to the horizontal in the illustrated orientation is 60°, and angle of the surface cross section relative to the vertical in the illustrated orientation is 30°). Hence, although the inner peripheral portion of the heat sink member 183 has a somewhat larger diameter than the outer peripheral portion of the light transmissive structure 176, the inner surface of the heat sink member 183 is machined to have an angle of approximately 120° with respect to the optical aperture surface 180 (interior angle with respect to the horizontal in the illustrated orientation of FIG. 9 is 60°, and angle of the surface cross section relative to the vertical in the illustrated orientation of FIG. 9 is 30°).

The ring shaped heat sink member 183 in the example is a single solid member, for example, formed of aluminum. Those skilled in the art will realize that other configurations may be used. The opposite side of heat sink member 183 may have a ring-shaped indentation for mating with the mask 179 (FIG. 9). The exemplary heat sink also includes one or more posts extending outward from the main part of the ring. Each post has a screw or bolt hole for passage of a bolt or similar fastener, for use in the assembly of the light engine 171 together with other housing components (not shown).

As assembled to form the light fixture or engine 171, the planar mounting section 181p of the flexible circuit board 181 is mounted on an attachment surface of the heat sink member 183 having an inner edge corresponding to the junction between angled inner surface and the mounting surface. In the illustrated downlight orientation (FIG. 9), that attachment surface of the heat sink member is on the top side of the heat sink member. The mounting section 181p of the flexible circuit board 181 may be attached to the planar attachment surface of the heat sink member 183 by an adhesive or glue or by any other cost-effective means.

The flexible tabs 181t are bent at a substantial angle with respect to the mounting section of the heat sink member 181, around the inner edge of that surface, by pressure of the near UV solid state emitters 151 mounted on the tabs 181t against the outer peripheral coupling surface 176p of the light transmissive structure 176. In the illustrated downlight orientation (FIG. 9), each tab will bend to an angle approximately the same as the angle of the surfaces that it fits between, in this case approximately 120° with respect to the optical aperture surface 180 (interior angle with respect to the horizontal in the illustrated orientation of FIG. 9 is 60°, and angle of the surface cross section relative to the vertical in the illustrated orientation of FIG. 9 is 30°).

The first surface of a tab 181t supports a near UV solid state light emitter 151 and receives heat from the emitter. The tab 181t is constructed to conduct the heat from the near UV solid state light emitter 151 to its opposite or second surface, for example, by inclusion of heat conductive surface pads and vias through the tab. The second surface of each respective one of the tabs provides heat transfer to the heat sink member 183, to permit heat transfer from each solid state emitter on each respective tab to the heat sink member.

In the example of FIG. 9, the fixture or light engine 171 also includes thermal interface material (TIM) 182 positioned between the second surface of each tab 181t and a corresponding inner surface of the heat sink member 183. The TIM 182 provides electrical insulation between the tabs 181t and the heat sink member 183, for example, for an implementation in which the heat slug of the near UV light emitter 151 is conductive. The TIM 182, however, also provides thermal conductivity to the heat sink member 183. In the examples, pressure created by contact of the solid state light emitters 151 with the angled optical coupling surface 176p along the outer peripheral portion of the light transmissive structure 176 compresses the TIM 182 against the surface of the heat sink member 183.

The positioning of each near UV light emitter 151 provides an orientation in which a central axis of emission of the respective light emitter (shown as an arrow from each LED in FIG. 9) is at a substantial angle with respect to the perpendicular axis of the aperture 174 and/or of the aperture surface 180 of the light transmissive structure 176. The angle of emission with respect to the aperture axis may be approximately perpendicular (90°). In this example (FIG. 9), however, the coupling surface 176p is at an angle so that the central axis of emission of the respective near UV light emitter 151 is directed somewhat more away from the optical aperture 174 and/or the aperture surface 180 of the light transmissive structure 176. Since, the central axis of emission of the respective light emitter 151 is substantially perpendicular to the coupling surface 176p, and the coupling surface 176p forms an obtuse angle with respect to the aperture surface 180, the central axis of emission of the respective light emitter 151 in this example is at an acute angle away from the aperture surface 180.

Although other angles may be used, the coupling surface 176p in the example forms an angle of approximately 120° with respect to the aperture surface 180, therefore the angle between the central axis of emission of the respective near UV light emitter 151 and the aperture surface 180 in this example is approximately 30°. From another perspective, this results in the central axis of emission of the respective solid state near UV light emission source 151 having approximately a 60° angle with respect to the perpendicular axis of the aperture 174 and/or of the aperture surface 180 of the light transmissive structure 176.

This angle of emission of near UV light from the solid state sources 151 reduces the amount of direct light emissions that impact the optical aperture surface 180 at a steep angle. At least in the region 174 forming the actual optical aperture, those direct light emissions that do impact the surface 180 impact at a relatively shallow angle. The portion 174 of the aperture surface 180 of the light transmissive solid 176 that serves as the optical aperture or light passage out of the optical integrating volume 172 exhibits total internal reflection with respect to near UV light reaching that surface directly from the solid state sources 151, and that total internal reflection reflects direct light emission hitting the surface at a shallow angle back into the optical integrating volume 172. In contrast, white light from the phosphor emissions and light that has been diffusely reflected from regions of the surface 173s, which arrive at larger angles to the surface 180 are not subject to total internal reflection and pass through portion 174 of the aperture surface 180 that forms the optical aperture.

The mask 179 therefore can be relatively small in that it only needs to extend far enough out covering the aperture surface 180 of the light transmissive solid 176 so as to block direct view of the LEDs 151 through the aperture 174 and to reflect those few direct emissions of the solid state light sources 151 that might otherwise still impact the surface 180 at too high or large an angle for total internal reflection. In this way, the combination of total internal reflection in the portion 174 of the surface 180 of the solid 176 together with the reflective mask 179 reflects all or at least substantially all of the direct near UV emissions from the light emitters 151, that otherwise would miss the reflector surface 173s, back into the optical integrating volume 172. Stated another way, a person in the area or region illuminated by the fixture 171 would not perceive the LED sources at 151 as visible individual light sources. Instead, virtually all light input to the volume from the solid state emitters 151 will diffusely reflect one or more times from the surface 173s before emergence through the aperture portion 174 of the surface 180 of the solid 176. This will insure one or more passes of the near UV light though the solid 176 containing the doped semiconductor nanophosphors, for excitation of those phosphors. Since the surface 173s provides diffuse reflectivity, the volume 172 acts as an optical integrating cavity so that the portion 174 of the surface 180 forms an optical aperture providing a substantially uniform virtual source output distribution of integrated white light (e.g. substantially Lambertian), mainly from the phosphor emissions by the doped semiconductor nanophosphors.

It is possible to utilize the total internal reflection to reduce the size of the mask 179 or otherwise enlarge the effective aperture (size of the optical passage) at 174 through which light emerges from the integrating volume 172. Due to the larger optical aperture or passage, the fixture 171 can actually emit more light with fewer average reflections within the integrating volume 172, improving efficiency of the fixture in comparison to prior fixtures that utilized cavities and apertures that were open to air.

In the example of FIG. 9, the solid state source devices 151 emit 405 nm near UV energy mostly toward the inner surface 173s of the reflector 173. 405 nm light emitted from a solid state device 151 in other directions is reflected by the inner surface of the mask 179 or total internal reflection at the optical aperture portion 174 of the surface 180 towards the inner reflective surface 173s of the reflector 173. As the 405 nm light from the emitting devices 151 and reflected from the mask and the aperture portion 174 of the surface 180 passes through the light transmissive solid 176, it excites the doped semiconductor nanophosphors in the solid 176. Any 405 nm light that has not yet excited a phosphor reflects from the diffusely reflective surface 173s of the reflector 173 back through the solid 176 and may excite the doped semiconductor nanophosphors in the solid 176 on the second or subsequent pass.

Light produced by the phosphor excitations, is emitted in all directions within the cavity 172. Much of that light is also reflected one or more times from the inner surface 173s of reflector 173, the inner surface of the mask 179 and the total internal reflection at the surface 55. At least some of those reflections, particularly those off the inner surface 173s of reflector 173, are diffuse reflections. In this way, the cavity 172 integrates the light produced by the various phosphor emissions into a highly integrated light for output via the optical aperture 174 (when reaching the surface at a steep enough angle to overcome the total internal reflection).

This optical integration by diffuse reflection within the cavity 172 integrates the light produced by the nano-phosphor excitation to form integrated light of the desired characteristics at the optical aperture 174 providing a substantially uniform output distribution of integrated light (e.g. substantially Lambertian) across the area of the aperture. As in the earlier examples, the particular doped semiconductor nanophosphors in the fixture 171 result in a light output that is at least substantially white and has a color rendering index (CRI) of 75 or higher. The white light output of the solid state light fixture 171 through optical aperture 174 exhibits color temperature in one of the specified ranges along the black body curve. The doped semiconductor nanophosphors may be selected and mixed to stack the emissions spectra thereof so that the white light output through optical aperture 174 exhibits color temperature of 2,725±145° Kelvin. Alternatively, the doped semiconductor nanophosphors may be selected and mixed to stack the emissions spectra thereof so that the white light output through optical aperture 174 exhibits color temperature of 3,045±175° Kelvin. As yet another alternative, the doped semiconductor nanophosphors may be selected and mixed to stack the emissions spectra thereof so that the white light output through optical aperture 174 exhibits color temperature of 3,465±245° Kelvin. As a further alternative, the doped semiconductor nanophosphors may be selected and mixed to stack the emissions spectra thereof so that the white light output through optical aperture 174 exhibits color temperature of and 3,985±275° Kelvin.

The effective optical aperture at 174 forms a virtual source of the light from lighting apparatus or fixture 171, which exhibits a relatively Lambertian distribution across the virtual source, as in the earlier examples. When the fixture illumination is viewed from the area illuminated by the combined light, the virtual source at 174 appears to have substantially infinite depth of the integrated light. Also, the visible intensity is spread uniformly across the virtual source, as opposed to one or more individual small point sources of higher intensity as would be seen if the one or more solid state sources were directly observable without sufficient diffuse processing before emission through an aperture. Again, the optical integration in the volume 172 reduces or eliminates pixilation and striation in the light output via the aperture 174. The light output exhibits a relatively low maximum-to-minimum intensity ratio across that region 174. In virtual source examples discussed herein, the virtual source light output exhibits a maximum to minimum ratio of 2 to 1 or less over substantially the entire optical output area. The area of the virtual source is at least one order of magnitude larger than the area of the point source output(s) of the near UV light solid state light emitter(s) 151. In this way, the diffuse optical processing may convert a single small area (point) source of light from a solid state emitter 151 to a broader area virtual source of white light at the region 174. The diffuse optical processing can also combine a number of such point source outputs to form one virtual source at the region of optical aperture 174.

As discussed in the earlier example of FIG. 6A, the optical aperture 174 at the surface 180 of the solid type light transmissive structure 176 may serve as the light output if the fixture 171, directing optically integrated light of relatively uniform intensity distribution to a desired area or region to be illuminated in accord with a particular general lighting application of the fixture. In such an arrangement, the fixture may include a trim ring or the like (not shown) covering some or all of the exposed components (but not the optical aperture 174). Although not shown in this example, there could be a lens, filter or diffuser (e.g. a holographic element) to help distribute the output light at the aperture 174.

However, the light engine example 171 of FIG. 9 may be used with other elements to form a commercial fixture. A commercial fixture product therefore might include the elements of the light engine, including the reflector 173, emitters 151, light transmissive structure 176 (with aperture surface 180), mask 179, heat sink ring 183, etc. Such a fixture might then further include upper and lower housings with cooling fins as well as a deflector in the lower housing. The deflector would be similar to the deflector 65 in the example of FIG. 6A.

As in the earlier examples, the near UV solid state light sources 151 in the example of FIG. 9 may be driven by any known or available circuitry that is sufficient to provide adequate power to drive the emitters at the level or levels appropriate to the particular lighting application of each particular fixture. Analog and digital circuits for controlling operations and driving the emitters are contemplated. Those skilled in the art should be familiar with various suitable circuits.

Figure 10:
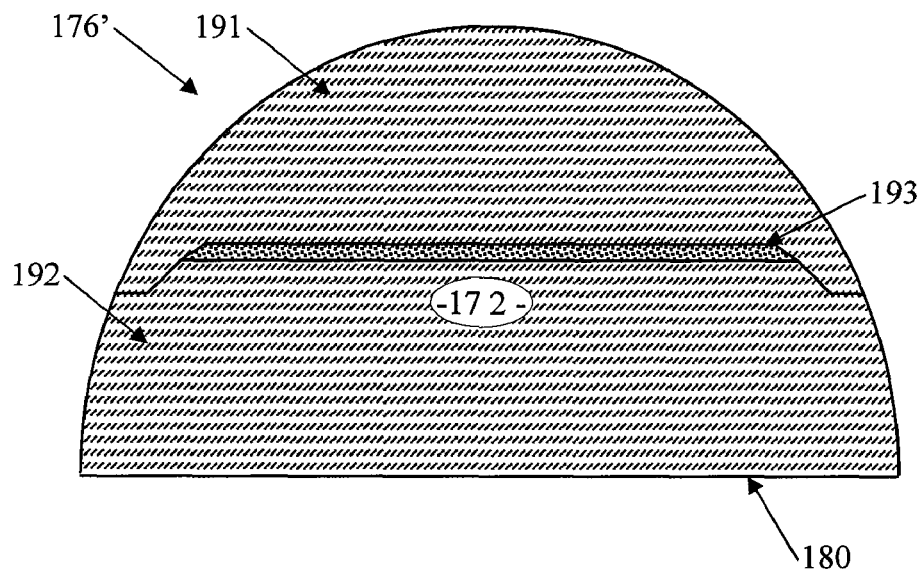
FIG. 10 is a cross-sectional view of an alternative construction of the light transmissive structure, for use in a fixture similar to that of FIG. 9, in which the structure is formed of two transmissive solid members with a semiconductor nanophosphor filled gap formed therebetween.

FIG. 10 is a cross-sectional view of an alternative construction of the light transmissive structure, here identified by number 176'. The light transmissive structure 176' is formed of two pieces 191 and 192, of light transmissive solid material. The material should be highly transmissive and exhibit low absorption with respect to the relevant light wavelengths, as discussed with regard to the solid structure 176 in the example of FIG. 9. Although other materials could be used, in this example, the two pieces 191 and 192 of the light transmissive structure 176' are formed of an appropriate glass. The glass may be highly transmissive and have low absorption, with respect to light of the relevant wavelengths. For example, the glass used may be at least a BK7 grade or optical quality of glass, or equivalent. In such an implementation, the highly transmissive glass exhibits 0.99 internal transmittance or better (BK7 exhibits a 0.992 internal transmittance).

External properties of the structure 176' will be similar to those of the structure 176 in the earlier example. For example, the contoured surface, at least in regions where there is no contact to a solid state light emitter, may have a roughened or etched texture. The outer peripheral region of the structure may be beveled or angled in-between the upper contoured region and the aperture surface (as shown 176p in FIG. 9). However, for ease of illustration, here (and in FIGS. 11 to 13B), the angled coupling surface is omitted, as might be the case if the LEDs were abutted against the light transmissive structure in a manner to emit light approximately in parallel to the aperture surface 180 (or perpendicular to the axis of the light transmissive structure).

Opposing surfaces of the two pieces 191 and 192 of the light transmissive structure 176' are contoured, to mate with each other around the periphery of the junction between the pieces but form a gap 193 between the two surfaces. The two pieces 191 and 192 of the light transmissive structure 176' may be shaped to provide the gap 193 at various locations and/or for the gap to have various shapes. For discussion purposes, the drawing shows the gap substantially parallel to the aperture surface 180 at a level spaced from that surface 180, and extending across a substantial portion but not all of the hemispherical structure at that level. The gap 193 contains the semiconductor nanophosphor material for excitation by near UV light energy. There may be some additional space in the gap, but in the exemplary structure 176', the material that includes the semiconductor nanophosphors at least substantially fills the volume of the gap 193. The semiconductor nanophosphors in the material are similar to those of the material 16 in the examples of FIGS. 1 to 4.

It may be desirable to encapsulate the semiconductor nanophosphor material in a manner that blocks out oxygen. Hence, in the example of FIG. 10, the two solid pieces or sections 191, 192 of the light transmissive structure 176' are both glass. The glass used is at least a BK7 grade or optical quality of glass, or equivalent. It is desirable for the solid, in this case the glass, to have a high transmissivity with respect to light of the relevant wavelengths processed within the cavity 172 and/or a low level of light absorption with respect to light of such wavelengths. Various sealing arrangements may be provided around the edges of the chamber formed by the gap 193, to maintain a good oxygen barrier to shield the semiconductor nanophosphors from oxygen, which otherwise degrades the semiconductor nanophosphors reducing the useful life of the semiconductor nanophosphors.

The semiconductor nanophosphor(s) may be provided in the gap 193 in the form of an ink or paint applied to one or both of the mating surfaces of the pieces 191 and 192. However, in the example of FIG. 10, the semiconductor nanophosphors in the gap 193 are carried in a binder or other medium so as to fill the gap 193. The medium preferably is highly transparent (high transmissivity and/or low absorption to light of the relevant wavelengths). Although alcohol, vegetable oil or other media may be used, in the example of FIG. 10, the medium may be a silicon material. If silicone is used, it may be in gel form or cured into a hardened form in the finished light fixture product.

The light transmissive structure 176' would be incorporated into a light engine much like that shown in FIG. 9. In such an implementation, the solid state sources would be sources similar to source 11 in FIGS. 1 and 2, which emit 405 nm light or other light in the 380-420 nm range. Electrically, the sources could be implemented, connected and driven in the manner shown in FIG. 14 or using any other suitable power supply and driver circuitry. As in FIG. 9, the light transmissive structure 176' together with the reflector would form an optical integrating volume. Like the examples of FIGS. 6A and 9, the near UV light from the sources would excite the semiconductor nanophosphors, in this case in the gap 193. The cavity would integrate the light for emission through a portion of surface 180 that forms the actual optical aperture or light passage for emission of integrated light from the cavity.

Again, the light produced by excitation of the semiconductor nanophosphor and as integrated in and output from the cavity would be at least substantially white and would have a CRI of 75 or better. The resulting light produced by the semiconductor nanophosphors and emitted from the cavity also would exhibit color temperature in one of the following four specific ranges along the black body curve: 2,725±145° Kelvin; 3,045±175° Kelvin; 3,465±245° Kelvin; and 3,985±275° Kelvin.

Figure 11:
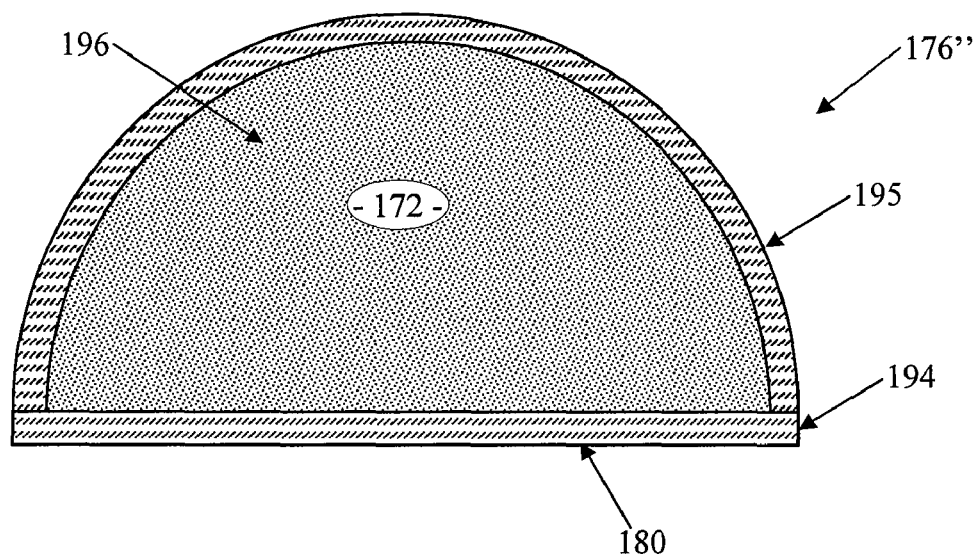
FIG. 11 is a cross-sectional view of an alternative construction of the light transmissive structure, for use in a fixture similar to that of FIG. 9, in which the structure is formed of a liquid-filled container for semiconductor nanophosphors, where the container and liquid form and/or fill the volume of the structure and thus the optical integrating cavity.

As noted, the present discussion encompasses a variety of different structural configurations for the light transmissive structure. As another approach (FIG. 11), instead of using a solid structure (e.g. FIG. 9) or solid structure with a gap or chamber for a semiconductor nanophosphor (FIG. 10), the light transmissive structure may comprise a container. Although the container could be filled with a gas, in the illustrated example, the container is filled with a liquid. The liquid then contains the semiconductor nanophosphors, particularly doped semiconductor nanophosphors. FIG. 11 is an example of a light transmissive structure 176" constructed in such a manner.

As shown in FIG. 11, the light transmissive structure 176" includes a container. Although other container structures may be used, for ease of illustration, the exemplary container is formed of a plate 194 and a hemispherical dome 195. As in the solid structure examples, these elements should exhibit high transmissivity and low absorption with respect to light of the relevant wavelengths, and there may or may not be an angled surface for light input coupling around the periphery. Although other materials could be used, to provide good containment and an excellent oxygen barrier, the example of FIG. 11 uses glass for the plate 194 and the dome 195, for example BK7 glass or equivalent.

In the example of FIG. 11, the container formed by the plate 194 and the dome 195 is filled with a liquid 196. The liquid 196 contains semiconductor nanophosphors, of the same types or categories as in the various earlier examples, which are excited by near UV light to produce white light of the properties specified herein. Those skilled in the art will recognize that there are various ways to join the components of the container, such as 194 and 195, together to form a liquid tight and air tight seal, and that there are various ways to fill the container with the desired liquid in a manner that eliminates at least substantially all oxygen bearing gases. In the illustrated example, the liquid 196 substantially fills the volume of the container formed by the elements 194 and 195, with little or no gas entrained in the liquid 196.

Semiconductor nanophosphors are often produced in solution. Near the final production stage, the semiconductor nanophosphors are contained in a liquid solvent. In the example of FIG. 11, such a liquid solution could be used as the solution 196. However, the solvents tend to be rather volatile/flammable, and other liquids such as water or vegetable oil may be used. The semiconductor nanophosphors may be contained in a dissolved state in solution, or the liquid and semiconductor nanophosphors may form an emulsion. The liquid itself may be transparent, or the liquid may have a scattering or diffusing effect of its own (caused by an additional scattering agent in the liquid or by the translucent nature of the particular liquid).

The container formed by the plate 194 and the dome 195, together with the liquid 196, substantially fill the optical volume 172, of the light fixture that incorporates the structure 176". External properties of the structure 176" will be similar to those of the structure 176 in the earlier example of FIG. 9. For example, the contoured surface, at least in regions where there is no contact to a solid state light emitter, may have a roughened or etched texture. Such an implementation would operate in a manner similar to the implementations of FIGS. 6A, 9 and 10. However, the liquid material may offer added operational efficiencies over implementations that entrain the semiconductor nanophosphor crystals in solid materials. Also, the dispersal in a clear or somewhat white/opaque liquid may tend to hide the coloration of the nanocrystals when not excited (while the lighting system is OFF).

Figure 12:
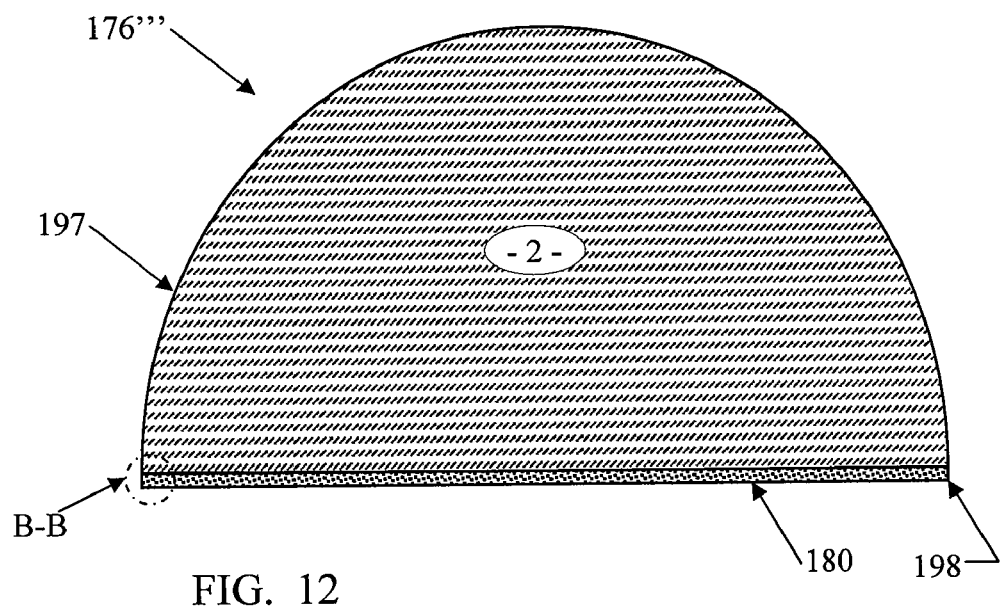
FIG. 12 is a cross-sectional view of yet another alternative construction of the light transmissive structure, for use in a fixture similar to that of FIG. 9, in which the light transmissive structure contains semiconductor nanophosphors at or near the aperture surface.

FIG. 12 is a cross-sectional view of yet another alternative construction of the light transmissive structure, here identified by number 176''', which incorporates a semiconductor nanophosphor bearing material. For example, the structure may utilize two pieces of the light transmissive solid with a gap therebetween, filled with the semiconductor nanophosphor bearing material, similar to the structure of FIG. 10. However, rather than positioning the semiconductor nanophosphors somewhat near the middle of the volume of the light transmissive structure as in FIG. 12, the arrangement of FIG. 12 locates the semiconductor nanophosphors near or at the optical aperture surface of the light transmissive structure.

In the example of FIG. 12, the light transmissive structure 176''' comprises a main section 197, which is essentially similar to the solid 176 the example of FIG. 9. However, the light transmissive structure 176''' also includes a section 198 containing the semiconductor nanophosphors and forming the aperture surface 180. The section 198 may be constructed in a number of different ways, two examples of which are represented by the enlarged detail sections (corresponding approximately to the region encircled at B-B in FIG. 12) of FIGS. 13A and 13B.

For example, the pieces of the light transmissive solid with a gap therebetween may consist of the main section 197 and an additional light transmissive member 681 (FIG. 15A). In such an arrangement, the semiconductor nanophosphor containment section 198a includes the member 681 and the gap formed between that member and the face of the main section 197. The gap is filled with a semiconductor nanophosphor material 199, such as discussed above relative to several of the earlier examples. The member 681 is attached to the section 197 in a manner to provide an air tight seal. In such an arrangement, the main section 197 and the light transmissive member 681 would typically be formed of glass, to insure that no air reaches the semiconductor nanophosphor contained in the gap.

In the other example (FIG. 13B), the semiconductor nanophosphor containment section 198b includes two pieces of the light transmissive solid members 682 and 683 with a gap therebetween, filled with semiconductor nanophosphors or a semiconductor nanophosphor material 199. In this arrangement, the solid element 682 is attached to or positioned against/adjacent to the face of the main section 197. The two light transmissive solid members 682 and 683 typically would be glass and would be sealed to contain the semiconductor nanophosphor in an air tight manner. However, with this arrangement, it may be feasible to use a different light transmissive material for the main section 197, as that section need not be impervious to gas leakage.

Figure 13A:
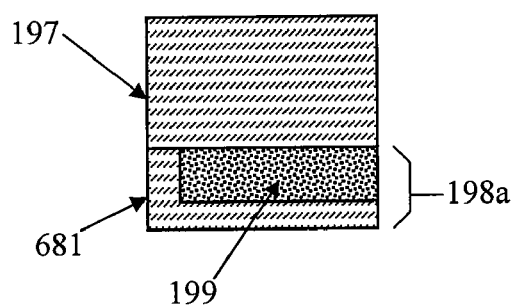
FIGS. 13A and 13B are detailed views of the cross-section in region B-B of FIG. 12, wherein semiconductor nanophosphor containment at or near the aperture is implemented in two somewhat different ways.
Figure 13B:
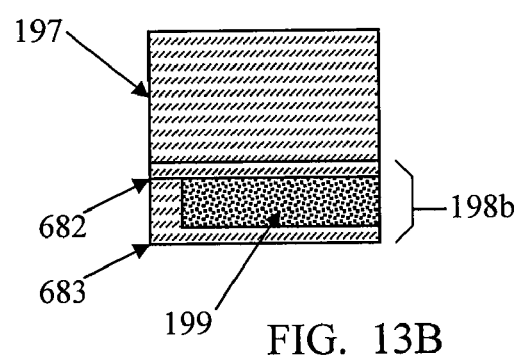

Again, in the examples of FIGS. 12, 13A and 13B, the light produced by excitation of the semiconductor nanophosphors and as integrated in and output from the cavity via an aperture portion of surface 180 would be at least substantially white and would have a CRI of 75 or better. The resulting light produced by the semiconductor nanophosphor and emitted from the optical aperture of the cavity also would exhibit color temperature in one of the following specific ranges along the black body curve: 2,725±145° Kelvin; 3,045±175° Kelvin; 3,465±245° Kelvin; and 3,985±275° Kelvin.

The solid state sources in any of the fixtures discussed above may be driven by any known or available circuitry that is sufficient to provide adequate power to drive the semiconductor devices therein at the level or levels appropriate to the lighting application of each particular fixture. Analog and digital circuits for controlling operations and driving the emitters are contemplated, and power may be derived from DC or AC sources. Those skilled in the art should be familiar with various suitable circuits. For many white light applications, the control circuitry may offer relatively simple user control, e.g. just ON/OFF or possibly with some rudimentary dimmer functionality. For example, in a general lighting application, a triac dimmable driver may be used to provide DC drive current from an AC power source. Such a driver offers ON/OFF control as well as level setting control responsive to triac variations of the AC waveform from a standard type dimmer unit.

Figure 14:
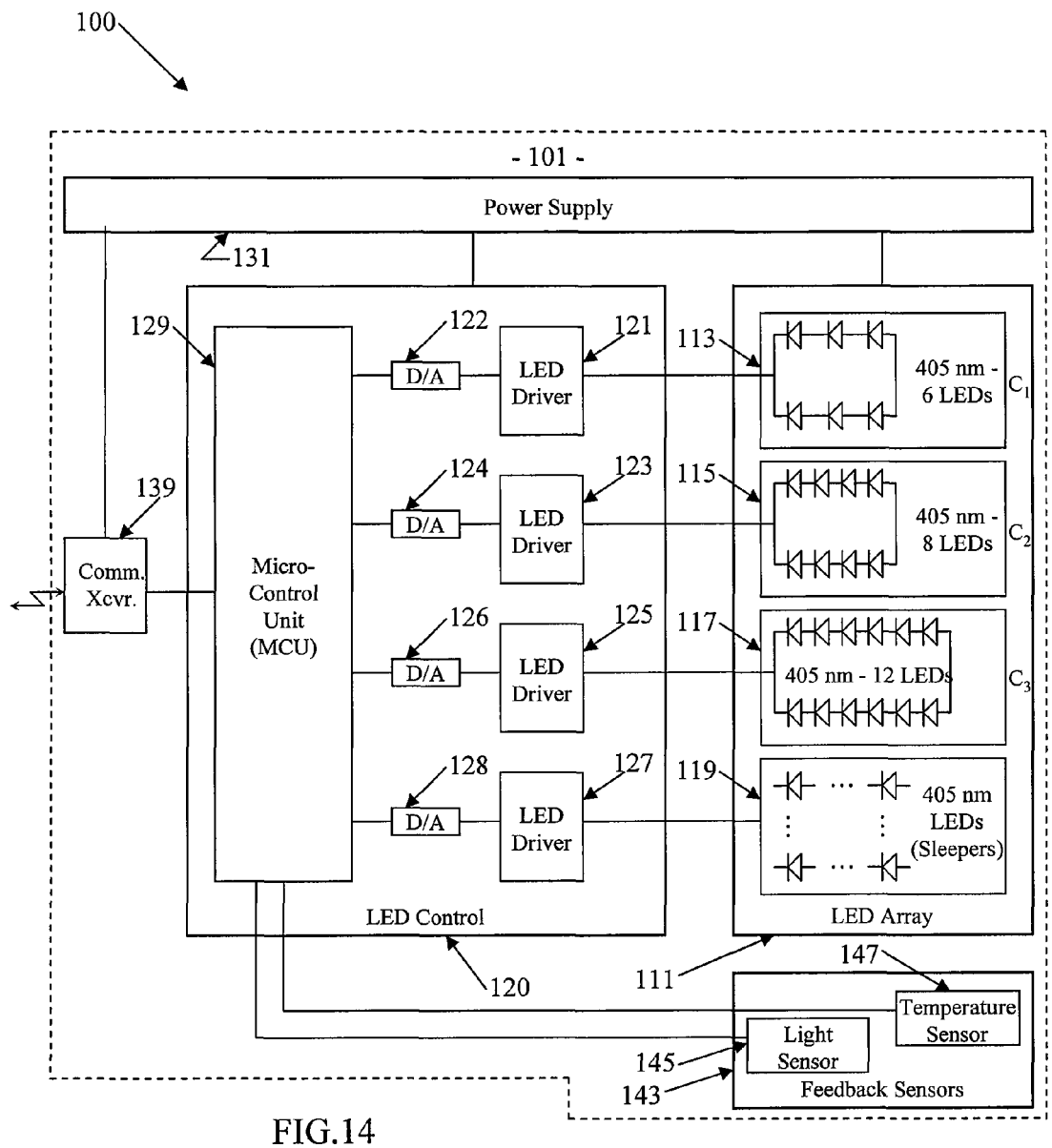
FIG. 14 is a functional block type circuit diagram, of an implementation of the system control circuit and LED array which may also offer dimming control.

However, for completeness, we will discuss an example of suitable circuitry, offering relatively sophisticated control capabilities, with reference to FIG. 14. That drawing figure is a block diagram of an exemplary solid state lighting system 100, including the control circuitry and the LED type sold state light sources. The LEDs and possibly some of the other electronic elements of the system could be incorporated into a fixture in any of the examples discussed above, with the LEDs shown in FIG. 14 serving as the various solid state sources of the 405 nm near UV light energy in the exemplary fixture. The circuitry of FIG. 14 provides digital programmable control of the light.

In the light engine 101 of FIG. 14, the set of solid state sources of near UV light takes the form of a LED array 111. A circuit similar to that of FIG. 14 has been used in the past, for example, for RGB type lighting (see e.g. U.S. Pat. No. 6,995,355). The same circuit is being used here with near UV LEDs but with different programming, to provide step-wise intensity control in a white lighting system having a substantial number of LEDs.

The array 111 comprises one or more 405 nm LEDs arranged in each of four different strings forming lighting channels C1 to C4. Here, the array 111 includes three initially active strings of LEDs, represented by LED blocks 113, 115 and 117. The strings may have the same number of one or more LEDs, or the strings may have various combinations of different numbers of one or more LEDs. For purposes of discussion, we will assume that the first block or string of LEDs 113 comprises 6 LEDs. The LEDs may be connected in series, but in the example, two sets of 3 series connected LEDs are connected in parallel to form the block or string of 6 405 nm near UV LEDs 113. The LEDs may be considered as a first channel C1, for control purposes discussed more later.

In a similar fashion, the second block or string of LEDs 115 comprises 8 405 nm LEDs. The 8 LEDs may be connected in series, but in the example, two sets of 4 series connected LEDs are connected in parallel to form the block or string of 8 405 nm near UV LEDs 115. The third block or string of LEDs 117 comprises 12 LEDs. The 12 LEDs may be connected in series, but in the example, two sets of 6 series connected LEDs are connected in parallel to form the block or string of 12 405 nm near UV LEDs 117. The LEDs 115 may be considered as a second channel C, whereas the LEDs 117 may be considered as a third channel C3 for control purposes discussed more later.

The LED array 111 in this example also includes a number of additional or 'other' LEDs 119. Some implementations may include various color LEDs, such as specific primary color LEDs, IR LEDs or UV LEDs, for various ancillary purposes. Another approach might use the LEDs 119 for a fourth channel of 405 nm LEDs to further control intensity in a step-wise manner. In the example, however, the additional LEDs 119 are 'sleepers.' Initially, the LEDs 113-117 would be generally active and operate in the normal range of intensity settings, whereas sleepers 119 initially would be inactive. Inactive LEDs are activated when needed, typically in response to feedback indicating a need for increased output (e.g. due to decreased performance of some or all of the originally active LEDs 113-117). The set of sleepers 119 may include any particular number and/or arrangement of the LEDs as deemed appropriate for a particular application.

Each string may be considered a solid state light emitting element or 'source' coupled to supply near UV light to the cavity or other fixture optic so as to pump or excite the semiconductor nanophosphor, where each such element or string comprises one or more light emitting diodes (LEDs) serving as individual solid state emitters. In the example of FIG. 14, each such element or string 113 to 119 comprises a plurality of the 405 nm LEDs.

The electrical components shown in FIG. 14 also include a LED control system 120. The control system 121 includes LED driver circuits for the various LEDs of the array 111 as well as a micro-control unit (MCU) 129. In the example, the MCU 129 controls the LED driver circuits via digital-to-analog (D/A) converters. The driver circuit 121 drives the LEDs 113 of the first channel C1, the driver circuit 123 drives the LEDs 115 of the second channel C2, and the driver circuit 125 drives the LEDs 117 of the third channel C3. In a similar fashion, when active, the driver circuit 127 provides electrical current to the other LEDs 119.

Although current modulation (e.g. pulse width modulation) or current amplitude control could be used, this example uses constant current to the LEDs. Hence, the intensity of the emitted light of a given near UV LED in the array 111 is proportional to the level of current supplied by the respective driver circuit. The current output of each driver circuit is controlled by the higher level logic of the system, in this case, by the programmable MCU 129 via the respective A/D converter.

The driver circuits supply electrical current at the respective levels for the individual sets of 405 nm LEDs 113-119 to cause the LEDs to emit light. The MCU 129 controls the LED driver circuit 121 via a D/A converter 122, and the MCU 129 controls the LED driver circuit 123 via a D/A converter 124. Similarly, the MCU 129 controls the LED driver circuit 125 via a D/A converter 126. The amount of the emitted light of a given LED set is related to the level of current supplied by the respective driver circuit.

In a similar fashion, the MCU 129 controls the LED driver circuit 127 via the D/A converter 128. When active, the driver circuit 127 provides electrical current to the sleeper LEDs 119.

The LED driver circuits and the microcontroller 129 receive power from a power supply 131, which is connected to an appropriate power source (not separately shown). For most general lighting applications, the power source will be an AC line current source, however, some applications may utilize DC power from a battery or the like. The power supply 131 provides AC to DC conversion if necessary, and converts the voltage and current from the source to the levels needed by the LED driver circuits and the MCU 129.

A programmable microcontroller or microprocessor, such as the MCU 129, typically includes or has coupled thereto random-access memory (RAM) for storing data and read-only memory (ROM) and/or electrically erasable read only memory (EEROM) for storing control programming and any pre-defined operational parameters, such as pre-established light data for the current setting(s) for the strings of LEDs 113 to 119. The microcontroller 129 itself comprises registers and other components for implementing a central processing unit (CPU) and possibly an associated arithmetic logic unit. The CPU implements the program to process data in the desired manner and thereby generates desired control outputs. The microcontroller 129 is programmed to control the LED driver circuits 121 to 127 via the A/D converters 122 to 128 to set the individual output intensities of the 405 nm LEDs to desired levels, and in this circuit example to implement a step-wise system intensity control by selectively activating and deactivating strings of LEDs. For an ON-state of a string/channel, the program of the microcontroller 129 will set the level of the current to the desired level at or around the rated current, by providing an appropriate data input to the D/A converter for the respective channel.

The electrical system associated with the fixture also includes a digital data communication interface 139 that enables communications to and/or from a separate or remote transceiver (not shown in this drawing) which provides communications for an appropriate control element, e.g. for implementing a desired user interface. A number of fixtures of the type shown may connect over a common communication link, so that one control transceiver can provide instructions via interfaces 139 to the MCUs 129 in a number of such fixtures. The transceiver at the other end of the link (opposite the interface 139) provides communications to the fixture(s) in accord with the appropriate protocol. Different forms of communication may be used to offer different links to the user interface device. Some versions, for example, may implement an RF link to a personal digital assistant by which the user could select intensity or brightness settings. Various rotary switches and wired controls may be used, and other designs may implement various wired or wireless network communications. Any desired medium and/or communications protocol may be utilized, and the data communication interface 139 may receive digital intensity setting inputs and/or other control related information from any type of user interface or master control unit.

To insure that the desired performance is maintained, the MCU 129 in this implementation receives a feedback signal from one or more sensors 143. A variety of different sensors may be used, alone or in combination, for different applications. In the example, the sensors 143 include a light intensity sensor 145 and a temperature sensor 147. The MCU 129 may use the sensed temperature feedback in a variety of ways, e.g. to adjust operating parameters if an excessive temperature is detected.

The light sensor 145 provides intensity information to the MCU 129. A variety of different sensors are available, for use as the sensor 145. In a cavity optic such as in the fixture in the system 50 of FIG. 6A, the light sensor 145 might be coupled to detect intensity of the integrated light either emitted through the aperture or as integrated within the optical cavity. For example, the sensor 145 may be mounted alongside the LEDs for directly receiving light processed within the optic. The MCU 129 uses the intensity feedback information to determine when to activate the sleeper LEDs 119. The intensity feedback information may also cause the MCU 129 to adjust the constant current levels applied to one or more of the strings 113 to 117 of 405 nm LEDs in the control channels C1 to C3, to provide some degree of compensation for declining performance before it becomes necessary to activate the sleepers.

Control of the near UV LED outputs could be controlled by selective modulation of the drive signals applied to the various LEDs. For example, the programming of the MCU 129 could cause the MCU to activate the A/D converters and thus the LED drivers to implement pulse width or pulse amplitude modulation to establish desired output levels for the LEDs of the respective control channels C1 to C3. Alternatively, the programming of the MCU 129 could cause the MCU to activate the A/D converters and thus the LED drivers to adjust otherwise constant current levels of the LEDs of the respective control channels C1 to C3. However, in the example, the MCU 129 simply controls the light output levels by activating the A/D converters to establish and maintain desired magnitudes for the current supplied by the respective driver circuit and thus the proportional intensity of the emitted light from each given string of LEDs. For an ON-state of a string/channel, the program of the MCU 129 will cause the MCU to set the level of the current to the desired level at or around the rated current, by providing an appropriate data input to the D/A converter for the particular channel. The LED light output is proportional to the current from the respective driver, as set through the D/A converter. The D/A converter will continue to output the particular analog level, to set the current and thus the LED output intensity in accord with the last command from the MCU 129, until the MCU 129 issues a new command to the particular D/A converter. While ON, the current will remain relatively constant. The LEDs of the string thus output near UV light of a corresponding relatively constant intensity. Since there is no modulation, it is expected that there will be little or no change for relatively long periods of ON-time, e.g. until the temperature or intensity feedback indicates a need for adjustment.

The current for the different channels C1 to C3 and/or the sleeper LEDs 119 may be different, e.g. if different numbers and/or types of LEDs are used, but where the LEDs in the array 111 are all of the same type, the current for the different channels C1 to C3 and/or the sleeper LEDs 119 in the ON state would all be approximately the same magnitude. For the OFF state of a particular string of LEDs 113 to 119, the MCU provides a 0 data input to the D/A converter for the respective string of LEDs.

Setting of the ON-OFF states of the LED strings 113-117 provides for selective control of the overall number of near UV LEDs of the array 111 that are ON in any given state. In the three main channel example (119 being for a sleeper channel), it is possible to control the states of the LED strings 113-117 to provide eight different brightness steps from 0 to 7, that is to say from all OFF (0 LEDs ON) to all 26 of the LEDs ON.

For the step-wise intensity control, the MCU 129 will control each driver via its associated A/D converter so as to supply constant current to the respective string of LEDs, at or around the rated current of the particular set of LEDs. Based on feedback, the MCU may adjust the level of the constant current somewhat, e.g. to compensate for some degree of degradation over time before it becomes necessary to activate the sleeper LEDs 119. In any case, the current level will remain within a range of the rated current for the particular string/channel of LEDs so that those LEDs produce the rated near UV light out, for interaction with the semiconductor nanophosphor in the fixture optic to generate the white light of the high CRI and desired color temperature, as discussed above.

In the example, there are 8 possible system states or intensities, which range from 0 for full OFF up to 7 for maximum ON. To select among the states, the communication interface 139 would receive a data signal from an input device, e.g. a user interface or a higher level automatic control, and would supply at least 3-bits of intensity control data to the MCU 129.

In the 0 state, all of the control channels C1 to C3 are OFF, and thus there are no LEDs ON. Conversely, in the 7 state, all of the control channels C1 to C3 are ON, and thus all 26 of the near UV LEDs 113-117 are ON and producing 405 nm light for excitation of the semiconductor nanophosphor in the optic. The other states provide a series of steps between full OFF and full ON. For example, at the brightness level number 1, only the first control channel C1 is ON, and the other channels C2 and C3 are OFF. In that state, only the 6 LEDs of the first control channel C1 are ON. At the brightness level number 2, only the second control channel C2 is ON, and the other channels C1 and C3 are OFF. In that state, only the 8 LEDs of the second control channel C2 are ON. Similarly, at the brightness level number 3, only the third control channel C3 is ON, and the other channels C1 and C2 are OFF. In that state, only the 12 LEDs of the third control channel C3 are ON. In the next three states (brightness levels 4-6) different combinations of two channels are ON concurrently. For example, at the brightness level number 4, the first control channel C1 and the second control channel C2 are both ON, but the other channel C3 is OFF. In that state, the 14 LEDs of the channels C1 and C2 are ON. At the brightness level number 5, the first control channel C1 and the third control channel C3 are both ON, but the other channel C2 is OFF. In that state, the 18 LEDs of the channels C1 and C3 are ON. Similarly, at the brightness level number 6, the second control channel C2 and the third control channel C3 are both ON, but the other channel C1 is OFF. In that state, the 20 LEDs of the channels C2 and C3 are ON.

The system can step up or down through the levels, in response to appropriate control inputs, e.g. received from a user interface element. Assuming that all of the LEDs generate approximately the same near UV light output at the rated current setting, the system intensity will be proportional to the number of near UV LEDs ON at each level. Hence, in the example, the possible brightness steps will correspond to the levels of intensity at which 0, 6, 8, 12, 14, 18, 20, and 26 of the near UV LEDs are ON, respectively. The doped semiconductor nanophosphors convert near UV light to the desired white light of the corresponding intensities.

In the example, assume that all of the LEDs in the array 111 are similar type near UV devices, e.g. each rated to produce 405 nm near UV light. All will have the same current rating at which they are all expected to pump the semiconductor nanophosphor to output white light of a high CRI and particular color temperature. Since there is no pulse modulation change, there is no potential to change a state which might otherwise cause perceptible flickering.

As noted earlier, the circuit of FIG. 14 also offers sleeper LEDs 119. With the channels C1 to C3 all ON, the system would operate at its rated output level, but typically that is around 90% of the maximum output possible for the array 111, as the sleepers 119 will be OFF. If the intensity achieved by activation of the channels C1 to C3 drops, for example as indicated by level of intensity detected by sensor 145, the MCU 129 can turn ON the string of sleepers 119, to return to the desired performance level. Sleepers 119 then could be always ON whenever the system is ON, and the MCU 129 would control intensity by ON-OFF control of the LEDs on channels C1 to C3.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A light fixture for a lighting application, comprising:
   a near ultraviolet (UV) solid state source, containing a semiconductor chip for producing near UV electromagnetic energy in a range of 380-420 nm;
   a macro optic outside and coupled to the near UV solid state source, for receiving and processing the near UV electromagnetic energy to produce a light output for the fixture; and
   at least one remote doped semiconductor nanophosphor associated with the macro optic and apart from the semiconductor chip, the remote doped semiconductor nanophosphor being of a type excited in response to near UV electromagnetic energy in the range of 380-420 nm from the solid state source for re-emitting visible light of a different spectrum,
   wherein:
      the visible light in the output for the fixture produced by near UV excitation of the remote doped semiconductor nanophosphor has a color temperature of one of the following ranges:
      2,725±145° Kelvin;
      3,045±175° Kelvin;
      3,465±245° Kelvin; and
      3,985±275° Kelvin.

2. The light fixture of claim 1, wherein the at least one remote doped semiconductor nanophosphor comprises:
   a doped semiconductor nanophosphor of a type excited in response to near UV electromagnetic energy in the range of 380-420 nm for re-emitting red or orange light;
   a doped semiconductor nanophosphor of a type excited in response to near UV electromagnetic energy in the range of 380-420 nm for re-emitting blue light; and
   a doped semiconductor nanophosphor of a type excited in response to near UV electromagnetic energy in the range of 380-420 nm for re-emitting green light.

3. The light fixture of claim 2, wherein the plurality of remote doped semiconductor nanophosphors further comprises a doped semiconductor nanophosphor of a type excited in response to near UV electromagnetic energy in the range of 380-420 nm for re-emitting yellowish-green or greenish-yellow light.

4. The light fixture of claim 2, wherein the visible light output produced during the near UV excitation of the doped semiconductor nanophosphors has a color rendering index (CRI) of 75 or higher.

5. The light fixture of claim 1, wherein
   the different spectrum has substantially no overlap with absorption spectra of the doped semiconductor nanophosphor, the remote doped semiconductor nanophosphor producing visible light in the output for the fixture from the fixture when excited.

6. The light fixture of claim 2, wherein the plurality of remote doped semiconductor nanophosphors further comprises a doped semiconductor nanophosphor of a type excited in response to near UV electromagnetic energy in the range of 380-420 nm for re-emitting yellow light.

7. The light fixture of claim 6, wherein visible light output produced during the near UV excitation of the doped semiconductor nanophosphors has a color rendering index (CRI) of at least 88.

8. The light fixture of claim 1, wherein the semiconductor chip of the near UV solid state source is configured for producing electromagnetic energy of 405 nm.

9. The light fixture of claim 1, wherein:
   the macro optic comprises a diffuser; and
   the at least one remote doped semiconductor nanophosphor is located at or near a surface of the diffuser.

10. The light fixture of claim 1, wherein:
    the macro optic comprises a reflector; and
    the at least one remote doped semiconductor nanophosphor is located at or near a surface of the reflector.

11. The light fixture of claim 1, wherein the macro optic comprises a diffuse reflector forming an optical integrating cavity for optically integrating visible light produced by near UV excitation of the at least one remote doped semiconductor nanophosphor to form the visible light output for the fixture.

12. The light fixture of claim 11, wherein:
    the macro optic comprises a light transmissive structure having an optical volume, the structure having a contoured outer surface and an optical aperture surface; and
    the diffuse reflector has a highly reflective interior surface extending over at least a substantial portion of the contoured outer surface of the light transmissive structure to form the optical integrating cavity to include the optical volume of the light transmissive structure, a portion of the aperture surface of the light transmissive structure forming an optical aperture of the cavity.

13. The light fixture of claim 12, wherein a portion of the volume of the light transmissive structure contains a material including the at least one remote doped semiconductor nanophosphor.

14. The light fixture of claim 13, wherein the material is a liquid and the remote doped semiconductor nanophosphors are dispersed in the liquid.

15. The light fixture of claim 11, further comprising a power supply for driving the solid state source to produce the near UV electromagnetic energy.

16. A light fixture for a general lighting application, comprising:
    at least one near ultraviolet (UV) solid state source containing a semiconductor chip for producing near UV electromagnetic energy in a range of 380-420 nm;

a reflector having at least one reflective surface forming an optical integrating cavity;
a light transmissive structure at least substantially filing the optical integrating cavity, a portion of a surface of the light transmissive structure forming an optical aperture of the optical integrating cavity to allow emission of light from the cavity for a light output of the fixture, the light transmissive structure being coupled to the solid state source to receive the near UV electromagnetic energy from the solid state source in a manner such that at least substantially all direct emissions from the semiconductor chip reflect at least once within the cavity;
a material associated with the light transmissive structure and apart from the semiconductor chip to receive electromagnetic energy from the semiconductor chip, the material including at least one remote doped semiconductor nanophosphor of a type excited in response to near UV electromagnetic energy in the range of 380-420 nm from the solid state source for re-emitting visible light of a different spectrum.

17. The light fixture of claim 16, wherein the at least one remote doped semiconductor nanophosphor includes a plurality of doped semiconductor nanophosphors.

18. The lighting fixture of claim 17, wherein:
(a) the visible light output for the fixture from the cavity produced by the excitation of the semiconductor nanophosphors is at least substantially white;
(b) the visible light output for the fixture from the cavity produced by the excitation of the semiconductor nanophosphors has a color rendering index (CRI) of 75 or higher; and
(c) the visible light output for the fixture from the cavity produced by excitation of the doped semiconductor nanophosphors exhibits color temperature in one of the following ranges:
2,725±145° Kelvin;
3,045±175° Kelvin;
3,465±245° Kelvin; and
3,985±275° Kelvin.

19. The light fixture of claim 18, wherein each semiconductor chip is configured for producing electromagnetic energy of 405 nm.

20. The light fixture of claim 16, wherein the at least one solid state source is positioned and oriented relative to the light transmissive structure so that any near UV electromagnetic energy reaching the optical aperture surface of the light transmissive structure directly from the solid state source impacts the optical aperture surface at a sufficiently small angle as to be reflected back into the optical integrating cavity by total internal reflection at the optical aperture surface of the light transmissive structure.

21. The light fixture of claim 20, wherein the material including the at least one remote doped semiconductor nanophosphor is located at or near the optical aperture surface of the light transmissive structure.

22. The light fixture of claim 16, wherein a portion of the volume of the light transmissive structure contains the material including the at least one remote doped semiconductor nanophosphor.

23. The light fixture of claim 22, wherein the material is a liquid and the at least one remote doped semiconductor nanophosphor is dispersed in the liquid.

24. The light fixture of claim 16, wherein the different spectrum has substantially no overlap with absorption spectra of the semiconductor nanophosphor, the semiconductor nanophosphor producing visible light in the output for the fixture from the cavity aperture when excited.

25. A light fixture for a lighting application, comprising:
a solid state source, containing a semiconductor chip for producing electromagnetic energy of a first spectral characteristic;
a macro optic outside and coupled to the solid state source, for receiving and processing the electromagnetic energy to produce a light output for the fixture; and
at least one remote doped semiconductor nanophosphor associated with the macro optic and apart from the semiconductor chip, the remote doped semiconductor nanophosphor being of a type excited in response to electromagnetic energy from the solid state source for re-emitting visible light of a second spectral characteristic.

26. The light fixture of claim 25, wherein the solid state source comprises at least one near ultraviolet (UV) solid state source for producing near UV electromagnetic energy.

27. The light fixture of claim 26, wherein the near UV electromagnetic energy is in a range of 380-420 nm.

28. The light fixture of claim 27, wherein the second spectral characteristic has substantially no overlap with absorption spectra of the doped semiconductor nanophosphor, the remote doped semiconductor nanophosphor producing visible light in the output for the fixture from the fixture when excited.

29. The light fixture of claim 28, wherein:
(a) the visible light in the output for the fixture produced by near UV excitation of the remote doped semiconductor nanophosphors is at least substantially white; (b) the visible light in the output for the fixture produced by near UV excitation of the remote doped semiconductor nanophosphors has a color rendering index (CRI) of 75 or higher.

30. The light fixture of claim 29, wherein the visible light in the output for the fixture produced by near UV excitation of the remote doped semiconductor nanophosphor has a color temperature of one of the following ranges:
2,725±145° Kelvin;
3,045±175° Kelvin;
3,465±245° Kelvin; and
3,985±275° Kelvin.

31. A light fixture for a lighting application, comprising:
a near ultraviolet (UV) solid state source, containing a semiconductor chip for producing near UV electromagnetic energy in a range of 380-420 nm;
a macro optic outside and coupled to the near UV solid state source, for receiving and processing the near UV electromagnetic energy to produce a light output for the fixture; and
at least one remote doped semiconductor nanophosphor associated with the macro optic and apart from the semiconductor chip, the remote doped semiconductor nanophosphor being of a type excited in response to near UV electromagnetic energy in the range of 380-420 nm from the solid state source for re-emitting visible light of a different spectrum,
wherein:
(a) the visible light in the output for the fixture produced by near UV excitation of the remote doped semiconductor nanophosphors is at least substantially white; and
(b) the visible light in the output for the fixture produced by near UV excitation of the remote doped semiconductor nanophosphors has a color rendering index (CRI) of 75 or higher.

32. The light fixture of claim 31, wherein the visible light in the output for the fixture produced by near UV excitation of the remote doped semiconductor nanophosphor has a color temperature of one of the following ranges:
2,725±145° Kelvin;
3,045±175° Kelvin;
3,465±245° Kelvin; and
3,985±275° Kelvin.

* * * * *